US012457711B2

(12) United States Patent
Kushner et al.

(10) Patent No.: US 12,457,711 B2
(45) Date of Patent: Oct. 28, 2025

(54) APPARATUS FOR TRANSFERRING HEAT FROM A HEAT SOURCE TO AIR

(71) Applicant: HUAWEI TECHNOLOGIES CO., LTD., Shenzhen (CN)

(72) Inventors: Dzmitry Kushner, Kista (SE); Christoffer Jarpner, Kista (SE); Vadim Tsoi, Kista (SE); Fredrik Ohlsson, Kista (SE); Ying Dong, Xi'an (CN); Marcus Lundh, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 148 days.

(21) Appl. No.: 18/538,908

(22) Filed: Dec. 13, 2023

(65) Prior Publication Data

US 2024/0206126 A1    Jun. 20, 2024

(30) Foreign Application Priority Data

Dec. 14, 2022    (EP) ..................................... 22213352

(51) Int. Cl.
    H05K 7/20        (2006.01)

(52) U.S. Cl.
    CPC ....... *H05K 7/2039* (2013.01); *H05K 7/20327* (2013.01)

(58) Field of Classification Search
    CPC .............. H05K 7/2039; H05K 7/20327; F28D 2021/0028; F28D 2021/0029; H01L 23/46; H01L 23/4735

(Continued)

(56) References Cited

U.S. PATENT DOCUMENTS 4,093,024 A * 6/1978 Middleton ............ F24S 10/504
                                                29/890.039
7,184,265 B2 * 2/2007 Kim ...................... H01L 23/467
                                                361/679.55

(Continued)

FOREIGN PATENT DOCUMENTS

| CN | 106686947 A | 5/2017 |
|---|---|---|
| TW | 202226932 A | 7/2022 |
| WO | 2021110235 A1 | 6/2021 |

OTHER PUBLICATIONS

Yan et al., "Thermal Analysis and Structure Optimization of Inflation-type Vapor Chamber Fin," Electro-Mechanical Engineering, vol. 36, Issue 6, Total 12 pages (Dec. 2020). With English Translation.

(Continued)

*Primary Examiner* — Claire E Rojohn, III
(74) *Attorney, Agent, or Firm* — Leydig, Voit & Mayer, Ltd.

(57) ABSTRACT

An apparatus for transferring heat from a heat source to air, comprising a heat sink with a plurality of fins. A fin of the plurality of fins is configured as follows: the fin comprises a conduit arrangement for a heat-carrying fluid; in a boiling region of the fin, the conduit arrangement comprises a vapour guiding path; and in the boiling region, the conduit arrangement comprises one or more boiling chambers. Each of the one or more boiling chambers has an outer boundary. The respective boiling chamber is located within a chamber region defined by an imaginary quadrilateral having four sides and four vertices. By means of the arrangement and configuration of the boiling chambers and/or of the vapour guiding path, the heat transfer efficiency of the fin is improved.

16 Claims, 20 Drawing Sheets

(58) Field of Classification Search
USPC .............................................. 165/80.3, 80.4
See application file for complete search history.

(56) References Cited

U.S. PATENT DOCUMENTS

| | | | | |
|---|---|---|---|---|
| 7,188,484 | B2* | 3/2007 | Kim | G06F 1/203 |
| | | | | 165/104.33 |
| 7,249,627 | B2* | 7/2007 | Choi | F28D 15/0233 |
| | | | | 165/104.21 |
| 7,420,807 | B2* | 9/2008 | Mikubo | H01L 23/467 |
| | | | | 361/698 |
| 7,486,517 | B2* | 2/2009 | Aapro | H05K 7/20436 |
| | | | | 361/705 |
| 7,552,759 | B2* | 6/2009 | Liu | F28D 15/0266 |
| | | | | 126/635 |
| 8,716,689 | B2* | 5/2014 | Chen | H01L 23/427 |
| | | | | 438/54 |
| 8,919,426 | B2* | 12/2014 | Hardesty | F28D 15/0233 |
| | | | | 165/104.21 |
| 9,007,769 | B2* | 4/2015 | Cheng | G06F 1/1656 |
| | | | | 257/77 |
| 9,918,407 | B2* | 3/2018 | Rosales | H05K 7/20436 |
| 9,999,157 | B2* | 6/2018 | Chiriac | G06F 1/20 |
| 10,353,445 | B2* | 7/2019 | Chiriac | H01L 23/427 |
| 10,746,474 | B2* | 8/2020 | Rosales | F28D 15/025 |
| D903,070 | S* | 11/2020 | Cheng | D23/323 |
| 10,989,483 | B2* | 4/2021 | Espersen | F28D 15/043 |
| 11,131,511 | B2* | 9/2021 | Chan | F28F 3/10 |
| 11,181,306 | B2* | 11/2021 | Zhang | B21D 22/00 |
| 11,181,323 | B2* | 11/2021 | Andrews | H01L 23/4275 |
| 11,221,162 | B2* | 1/2022 | Kao | F25D 23/061 |
| 11,369,042 | B2* | 6/2022 | Bortolato | F28D 15/0275 |
| 11,371,784 | B2* | 6/2022 | Kao | F28D 15/043 |
| 11,530,879 | B2* | 12/2022 | Lin | F28F 3/042 |
| 11,692,777 | B2* | 7/2023 | Lin | H01L 21/4871 |
| | | | | 165/104.22 |
| 11,819,903 | B2* | 11/2023 | Colugnati | F25B 39/024 |
| 11,913,726 | B2* | 2/2024 | Wen | F28F 3/14 |
| 11,971,219 | B2* | 4/2024 | Tan | F28D 15/0233 |
| 12,281,849 | B2* | 4/2025 | Chen | F28D 1/0316 |
| 2002/0170705 | A1* | 11/2002 | Cho | H01L 23/427 |
| | | | | 257/715 |
| 2003/0079865 | A1* | 5/2003 | Son | H01L 23/427 |
| | | | | 165/135 |
| 2005/0099776 | A1* | 5/2005 | Xue | H01L 23/427 |
| | | | | 257/E23.088 |
| 2006/0157227 | A1* | 7/2006 | Choi | H01L 23/427 |
| | | | | 165/104.21 |
| 2007/0012427 | A1* | 1/2007 | Liu | H01L 23/427 |
| | | | | 165/104.33 |
| 2007/0029070 | A1* | 2/2007 | Yamamoto | F04B 43/043 |
| | | | | 417/322 |
| 2007/0068654 | A1* | 3/2007 | Chang | H01L 23/427 |
| | | | | 29/890.032 |
| 2010/0149755 | A1* | 6/2010 | Tomioka | F28D 15/043 |
| | | | | 165/104.26 |
| 2011/0279978 | A1* | 11/2011 | Yoshikawa | H01L 23/427 |
| | | | | 361/700 |
| 2012/0111553 | A1* | 5/2012 | Tsoi | H05K 7/20245 |
| | | | | 165/185 |
| 2012/0199322 | A1* | 8/2012 | Frigiere | F28D 15/0266 |
| | | | | 165/104.34 |
| 2013/0098587 | A1* | 4/2013 | Tsoi | F28F 3/00 |
| | | | | 165/165 |
| 2013/0340978 | A1* | 12/2013 | Agostini | H05K 7/20309 |
| | | | | 165/104.21 |
| 2014/0246176 | A1* | 9/2014 | Yang | F28D 15/0266 |
| | | | | 165/104.26 |
| 2016/0079840 | A1* | 3/2016 | Tsoi | F04B 19/006 |
| | | | | 417/53 |
| 2017/0158046 | A1* | 6/2017 | Vezina | B60K 11/02 |
| 2017/0293329 | A1* | 10/2017 | Chiriac | G06F 1/20 |
| 2017/0295671 | A1* | 10/2017 | Chiriac | G06F 1/203 |
| 2018/0049346 | A1* | 2/2018 | Chiriac | H01L 23/427 |
| 2018/0266738 | A1* | 9/2018 | Li | F25B 39/02 |
| 2018/0308780 | A1* | 10/2018 | Tong | H01L 23/3733 |
| 2019/0212039 | A1* | 7/2019 | Zhang | B21D 22/00 |
| 2019/0353430 | A1* | 11/2019 | Narasimhan | F28D 15/0266 |
| 2020/0191492 | A1* | 6/2020 | Liu | F28F 3/14 |
| 2020/0232717 | A1* | 7/2020 | Kao | F28F 3/06 |
| 2021/0041191 | A1 | 2/2021 | Whitney et al. | |
| 2022/0128316 | A1* | 4/2022 | Wen | F28D 15/0233 |
| 2022/0290926 | A1* | 9/2022 | Ohlsson | F28D 15/0233 |
| 2024/0023281 | A1* | 1/2024 | Ohlsson | H05K 7/20336 |
| 2024/0206126 | A1* | 6/2024 | Kushner | H05K 7/20327 |

OTHER PUBLICATIONS

Deng et al., "Fabrication and thermal performance of a novel roll-bond flat thermosyphon," Applied Thermal Engineering 181 (2020) 115959, Total 15 pages (Aug. 2020).

Chen et al., "Experimental investigation on thermal management of lithium-ion battery with roll bond liquid cooling plate," Applied Thermal Engineering 206 (2022) 118106, Total 12 pages (Jan. 2022).

Agostini, "Roll-bond condenser in a two-phase thermosyphon loop for power electronics cooling," WIT Transactions on Engineering Sciences, vol. 75, Advanced Computational Methods and Experiments in Heat Transfer, Total 13 pages (Jun. 2012).

* cited by examiner

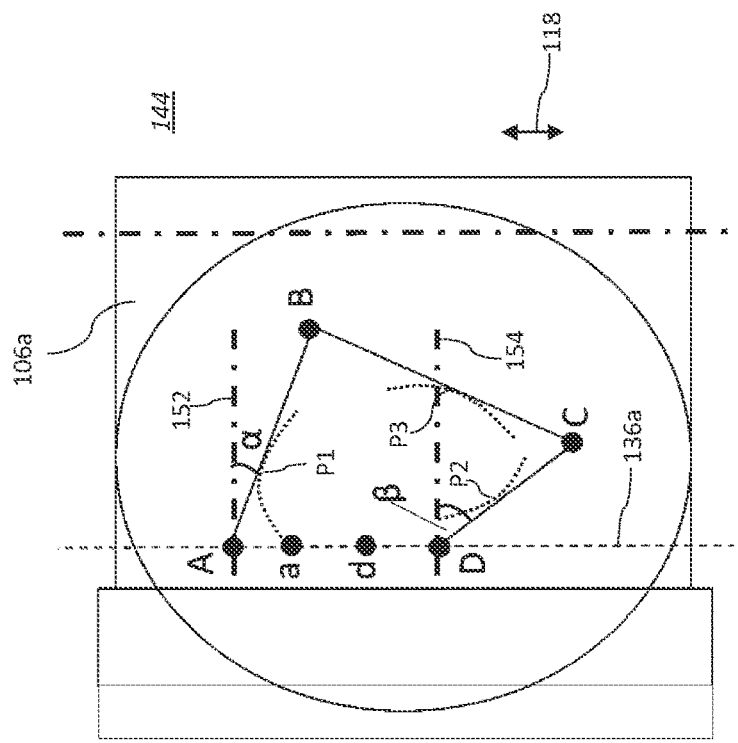
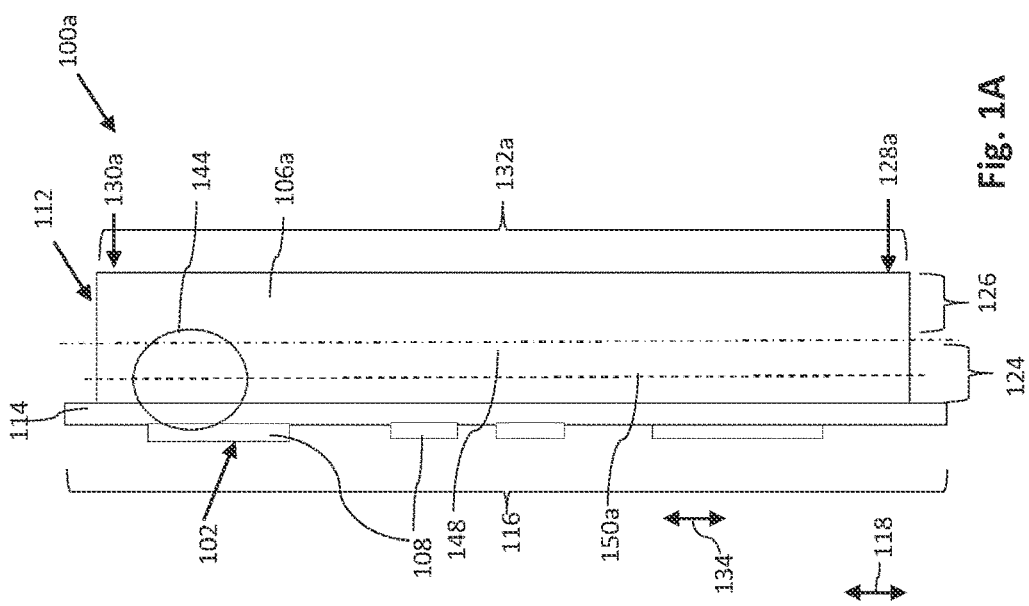

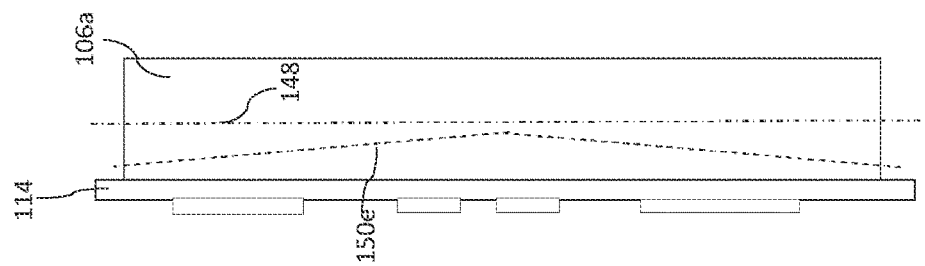
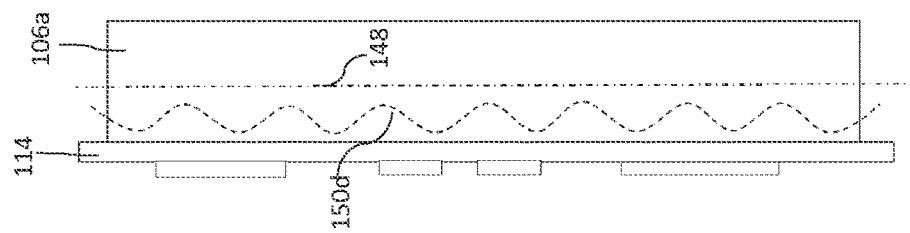
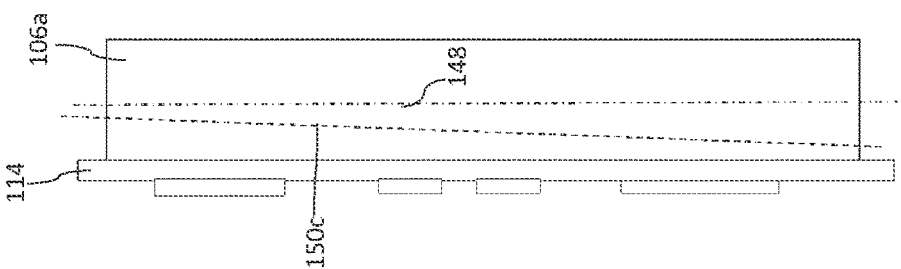
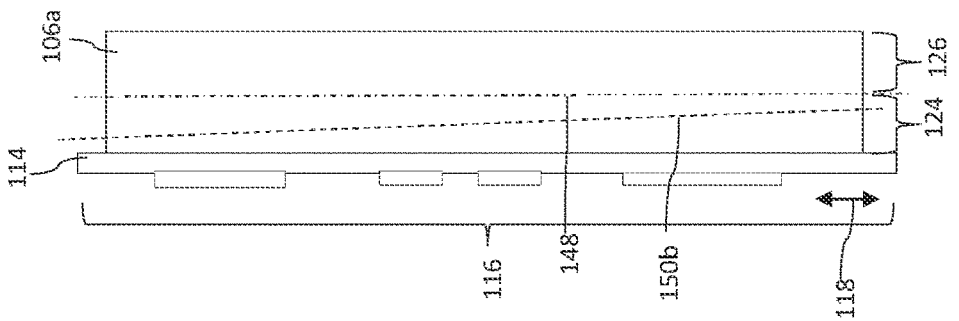
Fig. 2D
Fig. 2C
Fig. 2B
Fig. 2A

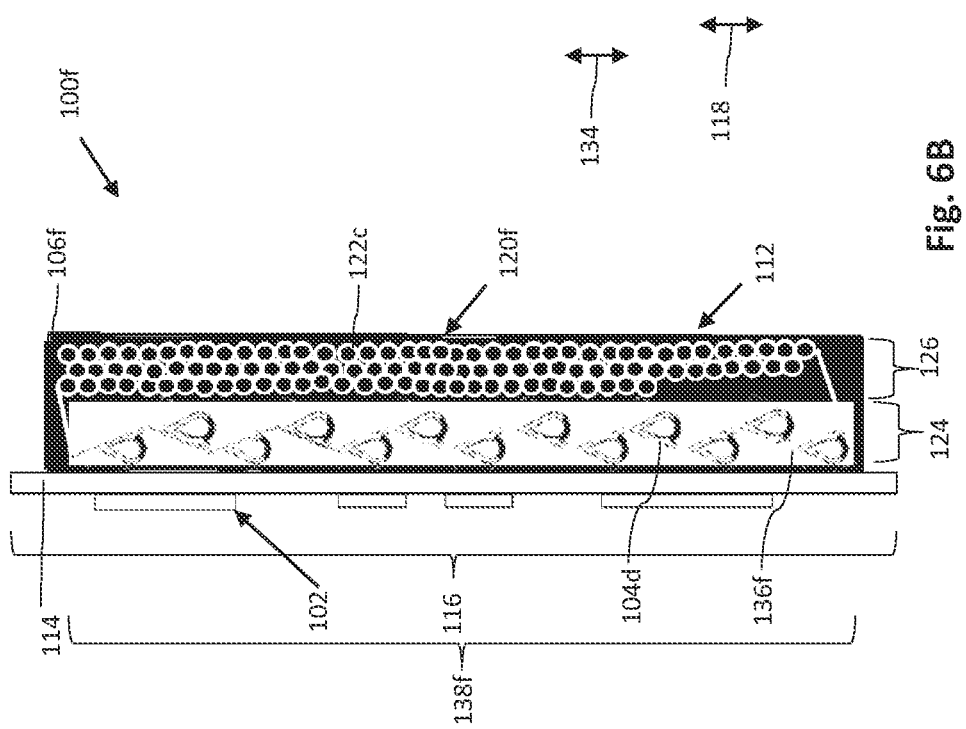
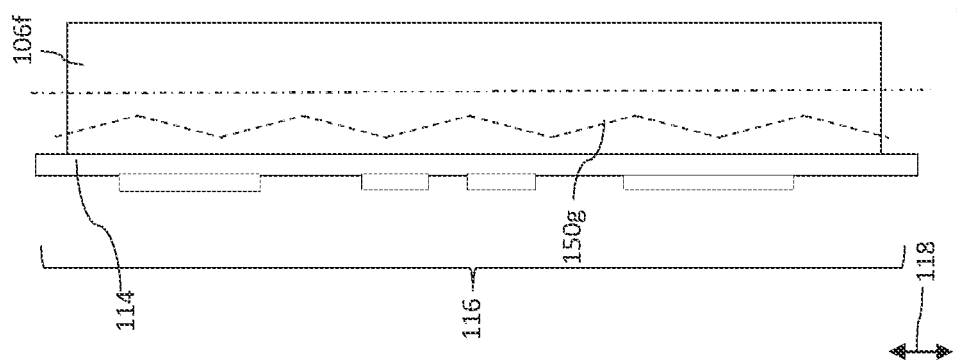
Fig. 6B
Fig. 6A

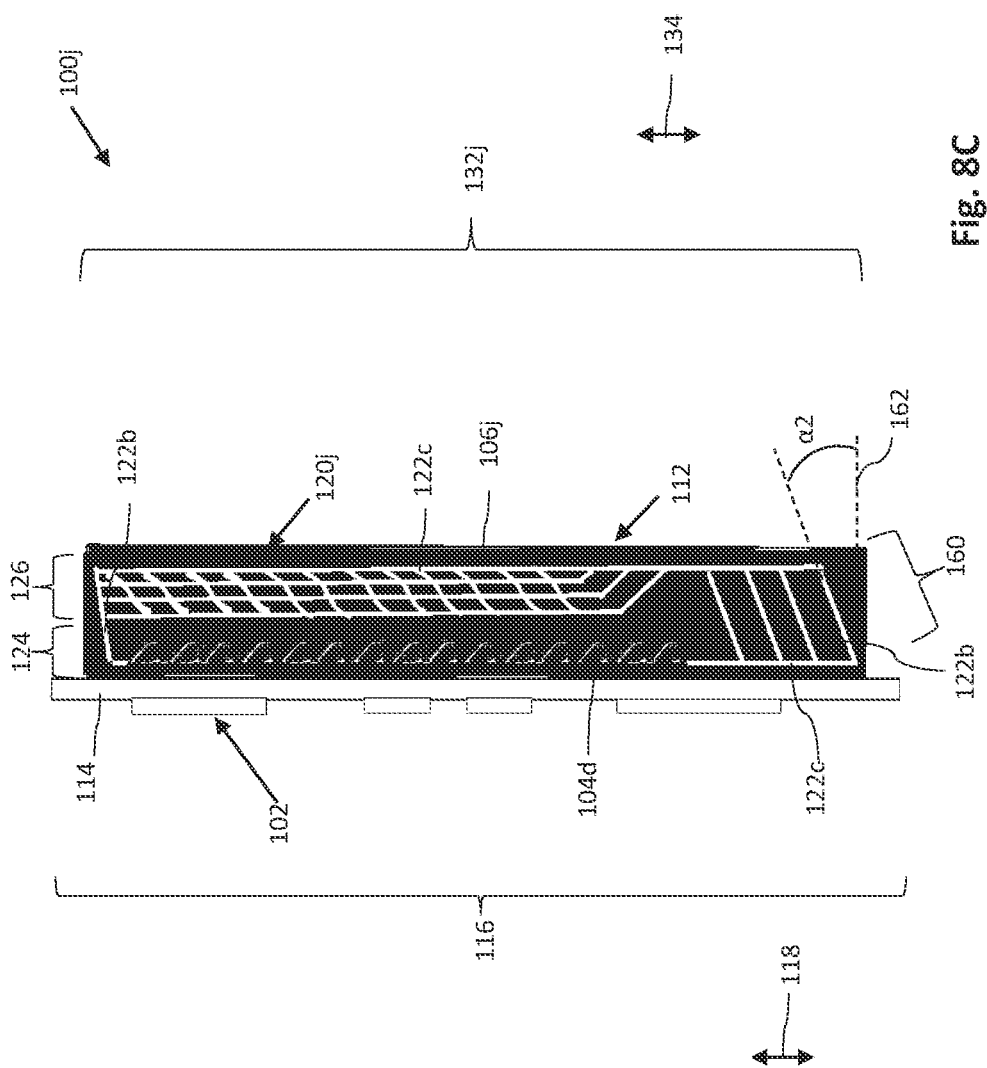

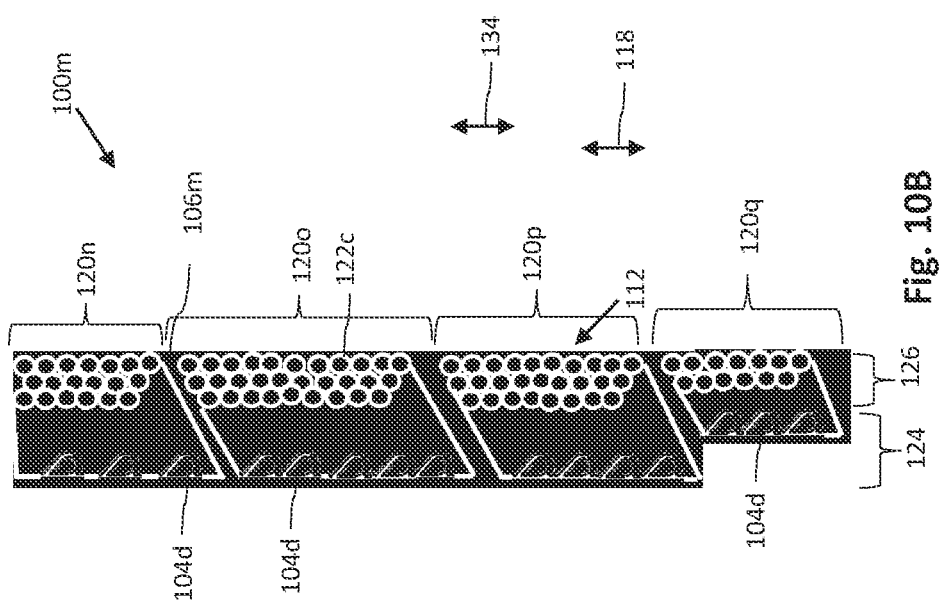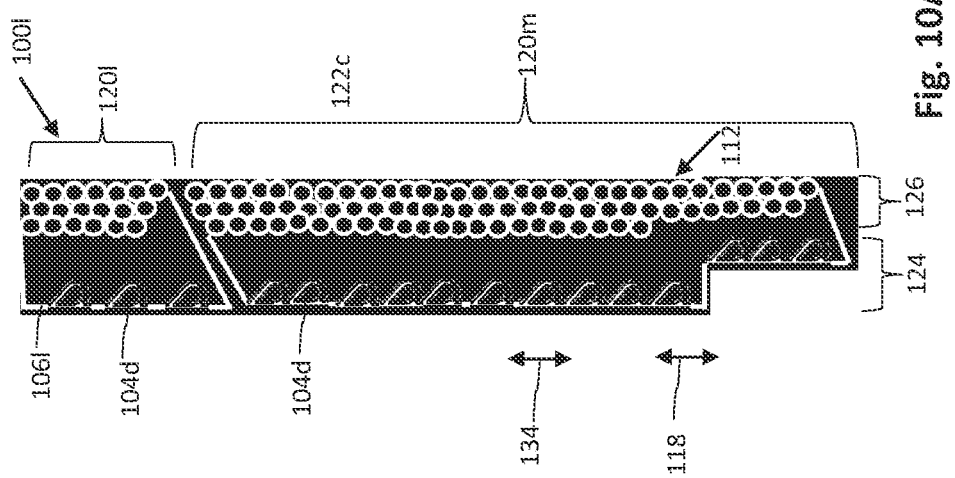

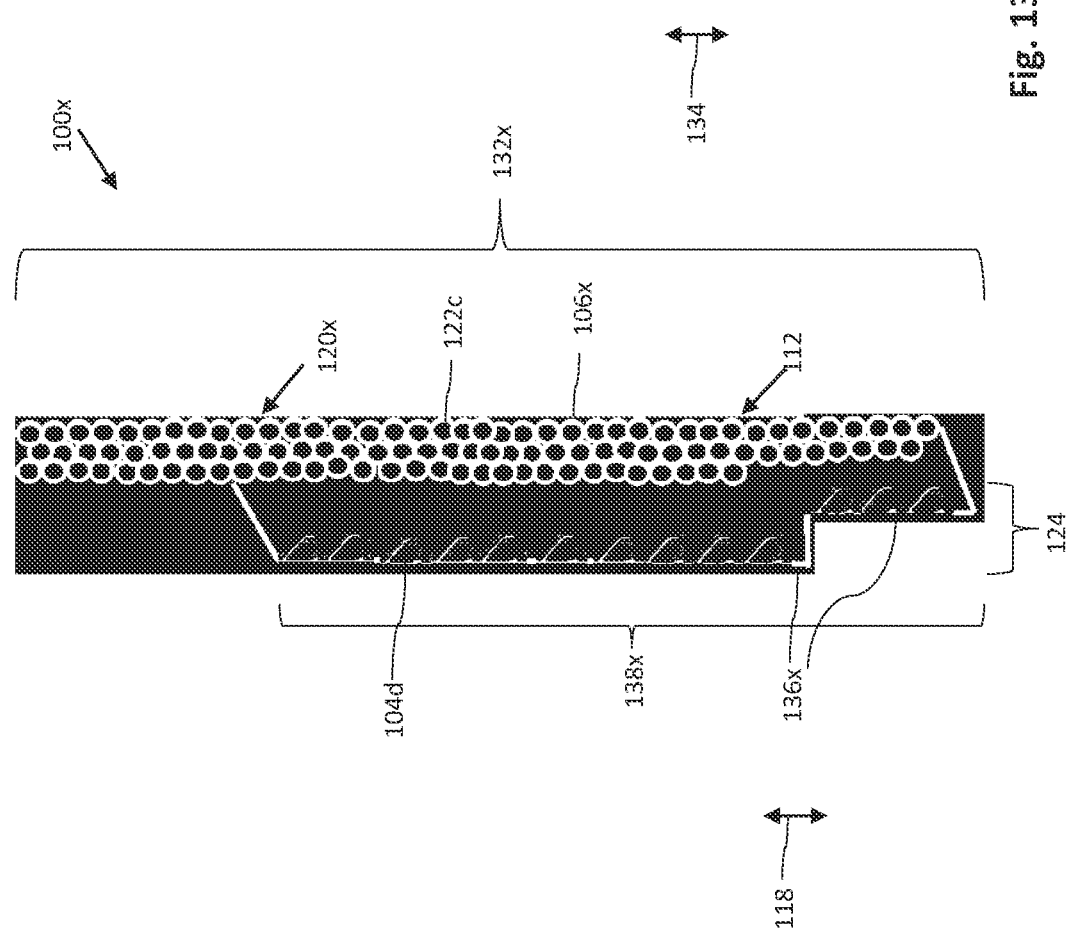

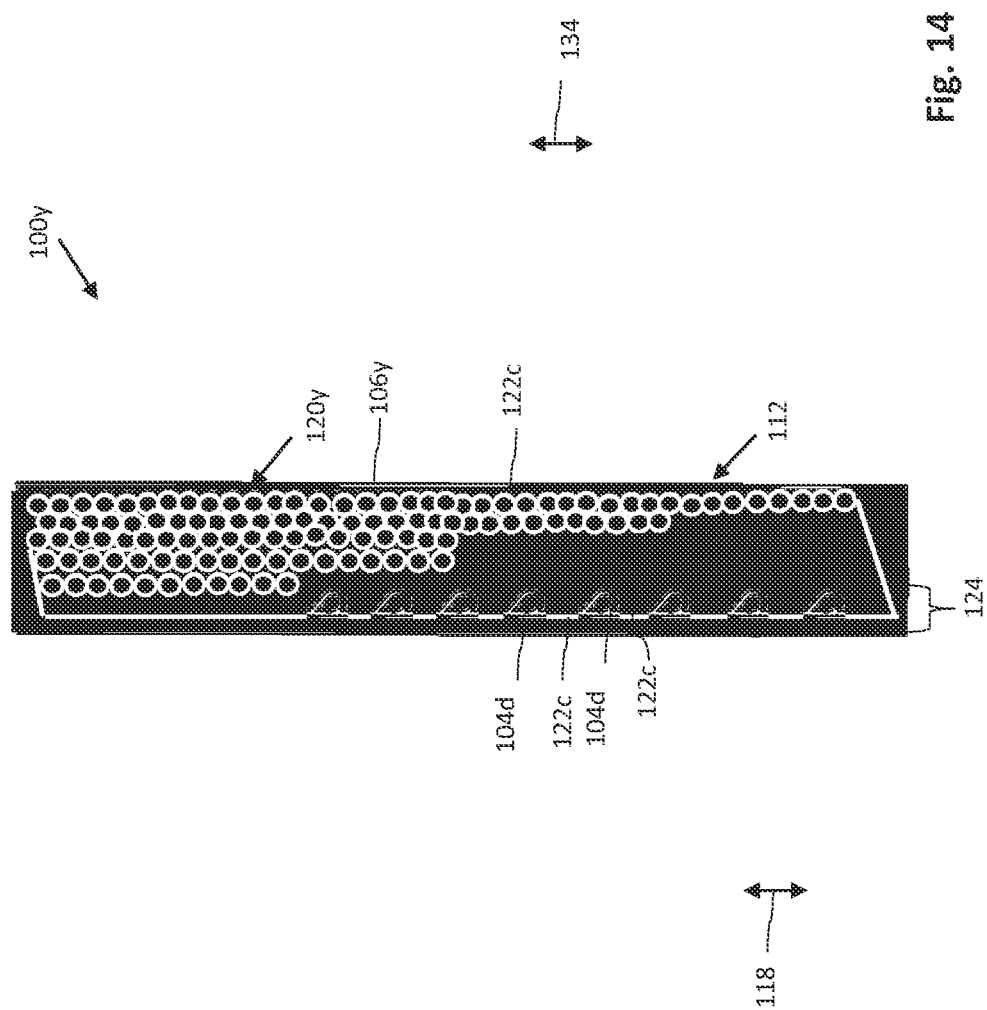

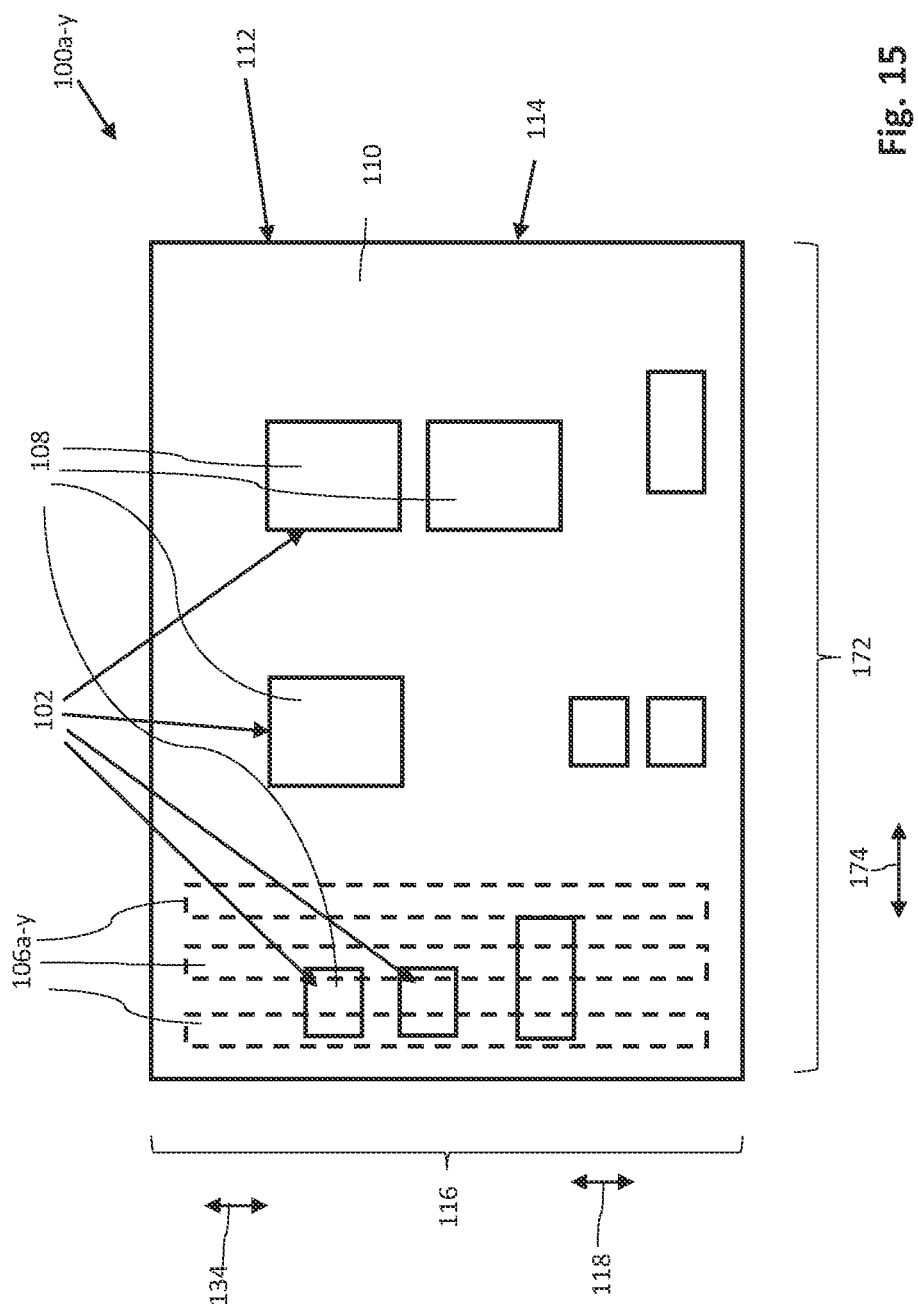

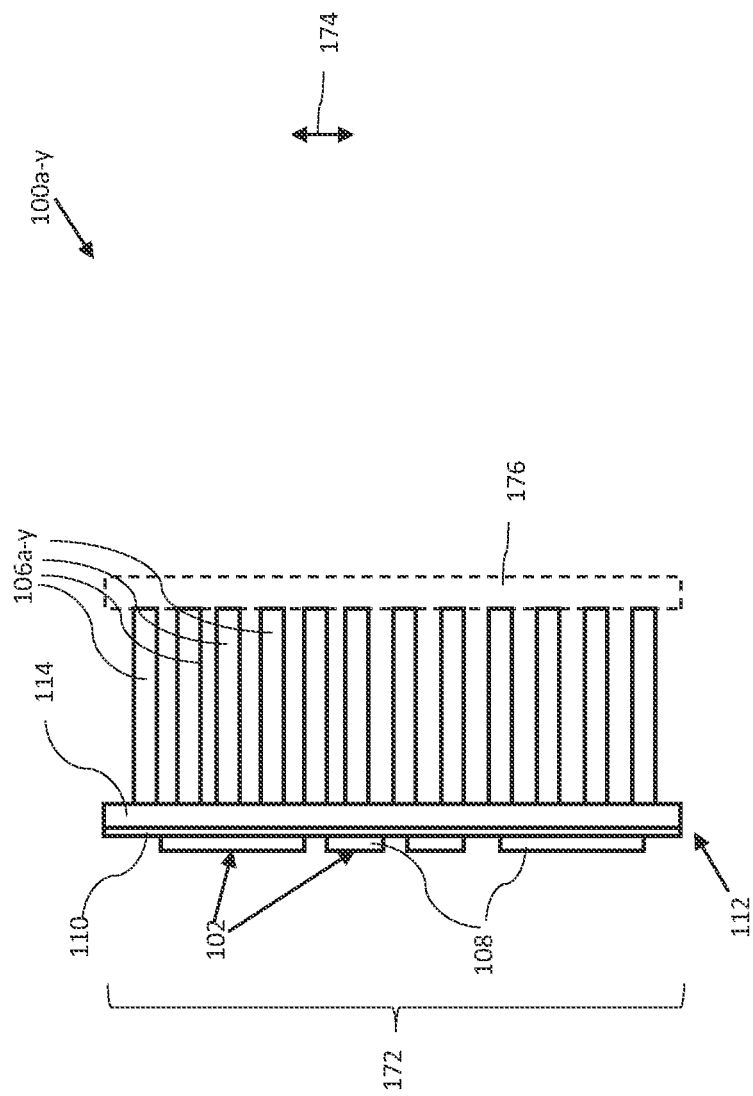

APPARATUS FOR TRANSFERRING HEAT FROM A HEAT SOURCE TO AIR

CROSS-REFERENCE TO RELATED APPLICATIONS

This application claims foreign priority to European Patent Application No. 22213352.2, filed on Dec. 14, 2022, the disclosure of which is hereby incorporated by reference in its entirety.

FIELD

The present application relates to an apparatus for transferring heat from a heat source to air when the apparatus is connected to the heat source. Further, the present application relates to a network access node for a wireless communication system, wherein the network access node comprises an apparatus of the above-mentioned sort.

BACKGROUND

Heat sinks are used in various fields of technology as conventional thermal management solutions, for example in the field of telecommunications, where a heat sink may be installed in a network access node, for example a base station unit or radio unit, to provide cooling. Cooling in a network access node is in general needed because of the heat sources or heat generators present in the network access node, for example a transmitter, a printed circuit board, optical transducers, power amplifiers etc. In general, a heat sink has a plurality of primary fins. Some cooling solutions in network access nodes are not efficient enough.

SUMMARY

An object of embodiments of the disclosure is to provide a solution which mitigates or solves the drawbacks and problems of conventional solutions.

The above-mentioned and further objects are solved by the subject matter of the independent claim. Further advantageous embodiments of the present application can be found in the dependent claims.

According to a first aspect of the present application, the above-mentioned and other objects are achieved with an apparatus for transferring heat from a heat source to air when the apparatus is connected to the heat source,
wherein the apparatus comprises a heat sink comprising multiple fins connected or connectable to a heat sink base configured to be thermally coupled to the heat source, the heat sink base having a longitudinal extension configured to extend in a vertical direction when the apparatus is installed,
wherein each or at least one of the fins is configured as follows:
the fin comprises a conduit arrangement comprising one or more conduits configured to enclose a heat-carrying fluid,
the fin comprises a boiling region and a condensation region through which the heat-carrying fluid is conveyed,
the fin is connected or connectable to the heat sink base such that the boiling region is positioned between the heat sink base and the condensation region,
the fin comprises a bottom portion and a top portion,
the fin has a longitudinal extension extending from the bottom portion to the top portion,
the fin is connected or connectable to the heat sink base such that the longitudinal extension of the fin extends in the direction of the longitudinal extension of the heat sink base,
in the boiling region the conduit arrangement comprises a vapour guiding path,
the vapour guiding path has a longitudinal extension extending in the direction of the longitudinal extension of the fin,
in the boiling region the conduit arrangement comprises one or more boiling chambers in which at least a portion of the fluid evaporates,
wherein the boiling chamber has an outer boundary,
wherein the boiling chamber is located within a chamber region defined by an imaginary quadrilateral having four sides and four vertices,
wherein a first vertex and a second vertex of the four vertices are located on the vapour guiding path,
wherein a third vertex and a fourth vertex of the four vertices are displaced from the vapour guiding path,
wherein the first vertex is located between the top portion of the fin and each one of the second, third and fourth vertices,
wherein the third vertex is located between the top portion of the fin and the fourth vertex,
wherein the second vertex is located between the top portion of the fin and the fourth vertex,
wherein the side of the imaginary quadrilateral extending from the first vertex to the third vertex has one or more tangent points with the outer boundary of the boiling chamber,
wherein the side of the imaginary quadrilateral extending from the second vertex to the fourth vertex has one or more tangent points with the outer boundary of the boiling chamber, and
wherein the boiling chamber is connected to the vapour guiding path via one or more orifices.

By way of the arrangement and configuration of the boiling chambers and of the vapour guiding path, an advantage of the apparatus according to the first aspect is that the heat transfer efficiency or equivalent thermal conductivity of the fin and/or of the entire heat sink is improved, whereby the heat source, for example an electric or electronic component, and/or the area around the heat source, are/is efficiently cooled. Thus, an advantage of the apparatus according to the first aspect is improved cooling performances, for example, an improved cooling of the heat source and/or the area around the heat source. An advantage of the apparatus according to the first aspect is that the heat-carrying fluid along the conduit arrangement can travel in the fin in an efficient manner and carry heat away from the heat sink base and away from the heat source at the end in an improved manner.

A result of the improved heat transfer efficiency or thermal conductivity of the fin and/or of the heat sink is that the volume and weight of the fin and/or of heat sink can be reduced in relation to conventional solutions without any risk of overheating or increase of temperature at the heat source, which is an advantage for a network access node for a wireless communication system, for example a base station. Consequently, the base station can be produced in a more efficient manner and take up less space when installed. An advantage of the apparatus according to the first aspect is that the fin and/or of the heat sink is/are less expensive to produce in relation to conventional solutions. The temperatures of typical electric or electronic components of a typical base station can be decreased significantly with a maintained volume and weight of the heat sink.

It is to be understood that a fluid can be a liquid, a vapour, and/or a mixture thereof. For example, during operation, in general the fluid includes both liquid and vapour. The heat source may be an electric or electronic component for example located on a printed circuit board, PCB. Further examples of a heat source are given in the detailed description herein below. However, other heat sources are possible. Each fin may be connected or connectable to the heat sink base by being attached or attachable to the heat sink base, or by being formed integrally with the heat sink base, for example, arranging an array of fins. For some embodiments, the boiling region may be referred to as an evaporation region, and the boiling chamber may be referred to as an evaporation chamber.

In an implementation form of an apparatus according to the first aspect, the boiling chamber comprises a fifth vertex and a sixth vertex limiting the one or more orifices, wherein the fifth and sixth vertices are located on the vapour guiding path, wherein the fifth vertex is located between the first vertex and the second vertex or at the position of the first vertex, and wherein the sixth vertex is located between the first vertex and the second vertex or at the position of the second vertex.

An advantage with this implementation form is that the heat-carrying fluid can be locked (or trapped) in the formed boiling chamber, thus providing sufficient liquid for boiling to occur above the top level (or boundary) of the liquid inside the conduit arrangement. This improves overall heat transmission and supports that the heat can be transferred in a more efficient manner, whereby the heat transfer efficiency and the cooling efficiency of the fin and/or of the heat sink are improved.

In an implementation form of an apparatus according to the first aspect, the boiling chamber is connected to the vapour guiding path via two orifices, wherein the fifth and sixth vertices are located between the first vertex and the second vertex, and wherein the first and fifth vertices limit one of the two orifices while the second and sixth vertices limit the other one of the two orifices.

An advantage with this implementation form is that the heat-carrying fluid is locked (or trapped) more efficiently (more deftly, or with more agility), thus providing more fluid to be stored in a boiling chamber, and thus providing more efficient heat transmission in a fin, allowing a 2-phase boiling phenomena to occur at the region above the top level (or boundary) of the fluid filled in the fin's conduit arrangement. This improves overall heat transmission and supports that the heat can be transferred in a more efficient manner and that the cooling efficiency of the fin and/or of the heat sink are improved.

In an implementation form of an apparatus according to the first aspect, the boiling chamber is connected to the vapour guiding path via one orifice, wherein the fifth vertex is located at the position of the first vertex, wherein the sixth vertex is located at the position of the second vertex, and wherein the fifth and sixth vertices limit the orifice.

An advantage with this implementation form is that the heat-carrying fluid is locked (or trapped) more efficiently (more deftly or with more agility), thus providing more fluid to be stored in a boiling chamber and, thus providing more efficient heat transmission in a fin, allowing a 2-phase boiling phenomena to occur at the region above the top level (or boundary) of the fluid filled in the fin's conduit arrangement. This improves overall heat transmission and supports that the heat can be transferred in a more efficient manner, whereby the cooling efficiency of the fin and/or of the heat sink is improved.

In an implementation form of an apparatus according to the first aspect, the acute angle formed between the side of the imaginary quadrilateral extending from the first vertex to the third vertex and a first axis intersecting the first vertex and being perpendicular to the direction of the longitudinal extension of the fin is greater than zero degrees and less than or equal to 90 degrees. An advantage with this implementation form is that it allows a boiling chamber to become capable to lock (or trap) and store the liquid above the top level (or boundary) of the fluid inside the conduit arrangement, thus providing efficient heat transfer due to the 2-phase boiling to occur in a boiling chamber and providing sufficient space of the conduit arrangement not occupied by fluid and acting as a condensation region in the fin. This improves overall heat transmission and supports that the heat can be transferred in an improved manner, whereby the equivalent thermal conductivity of the fin and/or of the heat sink is improved.

In an implementation form of an apparatus according to the first aspect, the acute angle formed between the side of the imaginary quadrilateral extending from the second vertex to the fourth vertex and a second axis intersecting the second vertex and being perpendicular to the direction of the longitudinal extension of the fin is greater than zero degrees and less than or equal to 90 degrees. An advantage with this implementation form is that it allows a boiling chamber to become capable to lock (or trap) and store the liquid above the top level (or boundary) of the fluid inside the conduit arrangement, thus providing efficient heat transfer due to the 2-phase boiling to occur in a boiling chamber and providing sufficient space of the conduit arrangement not occupied by fluid and acting as a condensation region in the fin. This improves overall heat transmission and supports that the heat can be transferred in an improved manner, whereby the equivalent thermal conductivity of the fin and/or of the heat sink is improved.

In an implementation form of an apparatus according to the first aspect, the acute angle formed between the side of the imaginary quadrilateral extending from the first vertex to the third vertex and the first axis is equal to the acute angle formed between the side of the imaginary quadrilateral extending from the second vertex to the fourth vertex and the second axis. An advantage with this implementation form is that the formed boiling chamber provides a more efficient locking of (trap for) liquid, above the top level (or boundary) of the fluid inside the conduit arrangement inside the fin. At the end, this feature improves overall heat transmission and supports that the heat can be transferred in an improved manner.

In an implementation form of an apparatus according to the first aspect, the length of the side of the imaginary quadrilateral extending from the first vertex to the third vertex multiplied by the cosine of the acute angle formed between the side of the imaginary quadrilateral extending from the first vertex to the third vertex and the first axis is equal to the length of the side of the imaginary quadrilateral extending from the second vertex to the fourth vertex multiplied by the cosine of the acute angle formed between the side of the imaginary quadrilateral extending from the second vertex to the fourth vertex and the second axis. An advantage with this implementation form is that the formed boiling chamber provides a more efficient lock (trap) feature for liquid, above the top level (or boundary) of the fluid inside the conduit arrangement inside the fin. At the end, this feature improves overall heat transmission and supports that the heat can be transferred in an improved manner.

In an implementation form of an apparatus according to the first aspect, the acute angle formed between the side of the imaginary quadrilateral extending from the first vertex to the third vertex and the first axis is greater than the acute angle formed between the side of the imaginary quadrilateral extending from the second vertex to the fourth vertex and the second axis. An advantage with this implementation form is that heat can be transferred in an improved manner. An advantage with this implementation form is that the formed boiling chamber provides a more efficient lock (trap) feature for liquid, above the top level (or boundary) of the fluid inside the conduit arrangement inside the fin. At the end, this feature improves overall heat transmission and supports that the heat can be transferred in an improved manner.

In an implementation form of an apparatus according to the first aspect, the length of the side of the imaginary quadrilateral extending from the first vertex to the third vertex multiplied by the cosine of the acute angle formed between the side of the imaginary quadrilateral extending from the first vertex to the third vertex and the first axis is greater than the length of the side of the imaginary quadrilateral extending from the second vertex to the fourth vertex multiplied by the cosine of the acute angle formed between the side of the imaginary quadrilateral extending from the second vertex to the fourth vertex and the second axis. An advantage with this implementation form is that the formed boiling chamber provides a more efficient lock (trap) feature for liquid, above the top level (or boundary) of the fluid in the conduit arrangement inside the fin. At the end, this feature improves overall heat transmission and supports that the heat can be transferred in an improved manner.

In an implementation form of an apparatus according to the first aspect, the side of the imaginary quadrilateral extending from the third vertex to the fourth vertex has one or more tangent points with the outer boundary of the boiling chamber. An advantage with this implementation form is that the boiling chamber is shaped to lock (or trap) the fluid efficiently and that there will be an increase of the amount of the entrained liquid from the vapour stream to be accumulated in a boiling chamber, located above the top level (or boundary) of the fluid filled in the conduit arrangement of the fin.

In an implementation form of an apparatus according to the first aspect, the boiling chamber comprises a conduit loop having two orifices. An advantage with this implementation form is that the heat-carrying fluid has the directed flow, entering and exiting the boiling chamber at designed locations. This feature improves overall heat transmission due to the absence of stagnation zones in the fin, where the fluid would have limited (low) velocity, which influences the efficiency of the fluid circulation and, at the end, temperature distribution of the fin and the entire heat sink.

In an implementation form of an apparatus according to the first aspect, the boiling chamber comprises a hexagonal conduit. An advantage with this implementation form is that the liquid is stored efficiently in a boiling chamber, providing enough liquid to boil so as to absorb heat energy from an electronic component acting as a heat source. Additionally, being of the same pattern as the condensation region, e.g. a hexagon pattern, this feature provides a lower cost solution in relation to conventional solutions, due to the absence of different geometries of the boiling chamber zone and condensation zone patterns of the conduit arrangement.

In an implementation form of an apparatus according to the first aspect, the hexagonal conduit has an outer boundary, wherein the outer boundary of the hexagonal conduit has six vertices and six sides, and wherein one of the six sides of the outer boundary of the hexagonal conduit is aligned with the vapour guiding path.

An advantage with this implementation form is that the liquid is stored efficiently in a boiling chamber, providing enough liquid to boil so as to absorb heat energy from an electronic component acting as a heat source. Additionally, being of the same pattern as the condensation region, e.g. a hexagon pattern, this feature provides a lower cost solution, due to the absence of different geometries of the boiling chamber zone and condensation zone patterns of the conduit arrangement.

In an implementation form of an apparatus according to the first aspect, the boiling chamber is configured to trap fluid in liquid form transported by a stream of fluid in vapour form flowing in the vapour guiding path in the direction of the longitudinal extension of the fin. An advantage with this implementation form is that the heat-carrying fluid can be locked (or trapped) in a number of boiling chambers located above the top level (or boundary) of the fluid filling the conduit arrangement of the fin, thus avoiding a costly and cumbersome conventional application of capillary structures (wicks) inside the conduit arrangement, in order to suck up (pump up) the liquid against gravity direction along the longitudinal extension of the fin.

In an implementation form of an apparatus according to the first aspect, the side of the imaginary quadrilateral extending from the first vertex to the second vertex extends in the direction of the longitudinal extension of the vapour guiding path. An advantage with this implementation form is that heat can be transferred in an improved manner, whereby the equivalent thermal conductivity of the fin and/or of the heat sink is improved.

In an implementation form of an apparatus according to the first aspect, the imaginary quadrilateral is located in a vertical plane when the fin is connected to the heat sink base. An advantage with this implementation form is that such arrangement supports certain (or defined) directional movement (circulation) of the fluid along a loop defined by the conduit arrangement.

In an implementation form of an apparatus according to the first aspect, the orifice is positioned on the side of the imaginary quadrilateral extending from the first vertex to the second vertex. An advantage with this implementation form is that heat can be transferred in an improved manner. An advantage with this implementation form is that the thermal conductivity of the fin and/or of the heat sink is improved.

In an implementation form of an apparatus according to the first aspect, the longitudinal extension of the vapour guiding path extends from the bottom portion to the top portion of the fin. An advantage with this implementation form is that heat can be transferred in an improved manner. An advantage with this implementation form is that the heat-carrying fluid has the directed flow, entering and exiting the boiling chamber at the designed locations. This feature improves overall heat transmission due to the absence of stagnation zones in the fin, where the fluid would have limited (low) velocity, which influences the efficiency of the fluid circulation and, at the end, temperature distribution of the fin and the entire heat sink.

In an implementation form of an apparatus according to the first aspect, the conduit arrangement comprises two or more interconnection conduits connecting the one or more conduits of the boiling region to the one or more conduits of the condensation region. An advantage with this implementation form is that heat can be transferred in an improved manner. An advantage with this implementation form is that the thermal conductivity of the fin and/or of the heat sink is improved.

In an implementation form of an apparatus according to the first aspect, the interconnection conduit has one or more longitudinal extensions, wherein an acute angle is formed between the longitudinal extension of the interconnection conduit and an axis perpendicular to the direction of the longitudinal extension of the fin. An advantage with this implementation form is that heat can be transferred in an improved manner. An advantage with this implementation form is that the thermal conductivity of the fin and/or of the heat sink is improved.

In an implementation form of an apparatus according to the first aspect, the fin forms one or more through-holes for air to pass, wherein the through-hole is located between the boiling chambers and the condensation region. An advantage with this implementation form is that the heat transfer from the heat sink base can be tailored in view of the heat load of each heat source and in view of the positions of the heat sources in relation to the fins, whereby an efficient heat transfer is provided. An advantage with this implementation form is the ability to manage (or to tailor) the split of the heat dissipation ratios, covered by heat conduction through the metallic body (case) of the fin and by 2-phase heat transmission, that involves the heat-carrying fluid circulating through the conduit arrangement. Thus, a more efficient design of a fin and of the entire heat sink is attained, depending on the actual heat load map (electronic components with their locations and their heat powers) of a printed circuit board, PCB.

In an implementation form of an apparatus according to the first aspect, the fin comprises two or more conduit arrangements. An advantage with this implementation form is the ability to manage (or to tailor) the split of the heat dissipation ratios, covered by heat conduction through the metallic body (case) of the fin and by 2-phase heat transmission, that involves the heat-carrying fluid circulating through the conduit arrangement. Thus, a more efficient design of a fin and of the entire heat sink is attained, depending on the actual heat load map (electronic components with their locations and their heat powers) of printed circuit board, PCB. An advantage with this implementation form is that the heat transfer from the heat sink base can be tailored in view of the heat load of each heat source and in view of the positions of the heat sources in relation to the fins, whereby an efficient heat transfer is provided. An advantage with this implementation form is that transmission of heat can be controlled in an improved manner and that the thermal conductivity of the fin and/or of the heat sink is improved.

In an implementation form of an apparatus according to the first aspect, in the boiling region the conduit arrangement comprises two or more parallel vapour guiding paths. An advantage with this implementation form is that the heat transfer from the heat sink base can be tailored in view of the heat load of each heat source and in view of the positions of the heat sources in relation to the fins, whereby an efficient heat transfer is provided. An advantage with this implementation form is that transmission of heat can be controlled in an improved manner, such that the boiling ratio can be increased, among the whole heat transmission mechanism taking part in the heat transfer through the heat sink and the fins. Thus, the overall heat transmission efficiency is improved, as the 2-phase heat transfer, i.e. boiling, is the most efficient one, among the others (heat conduction, heat convection and heat radiation). Therefore, the heat transmission from heat sources, or the electronic components, toward air through the heat sink and the fins is realized in an improved manner.

In an implementation form of an apparatus according to the first aspect, in the condensation region the conduits of the conduit arrangement comprise one or more of the group of:
   a hexagonal conduit;
   an annular conduit;
   a circular conduit;
   an oval conduit;
   a mesh-shaped conduit system;
   a straight conduit; and
   a straight conduit having a longitudinal extension extending in the direction of the longitudinal extension of the fin.

An advantage with this implementation form is that transmission of heat can be controlled in an improved manner. An advantage with this implementation form is that heat can be transferred in an improved manner. An advantage with this implementation form is that the equivalent thermal conductivity of the fin and/or of the heat sink is improved.

In an implementation form of an apparatus according to the first aspect, the fin is formed from one or more plates made of a material comprising or consisting of a metal or a metal alloy by way of press forming so as to form the conduit arrangement.

In an implementation form of an apparatus according to the first aspect, the fin is formed from one or more layers made of a material comprising or consisting of a metal or a metal alloy by way of roll-bonding so as to form the conduit arrangement.

In an implementation form of an apparatus according to the first aspect, the fin comprises a first end portion and a second end portion, wherein the fin has a transverse extension extending from the first end portion to the second end portion.

In an implementation form of an apparatus according to the first aspect, the boiling region is located in the first end portion, wherein the condensation region is located in the second end portion.

In an implementation form of an apparatus according to the first aspect, the first end portion comprises the boiling region, wherein the second end portion comprises the condensation region.

In an implementation form of an apparatus according to the first aspect, the heat sink base has a transverse extension configured to extend in a horizontal direction when the apparatus is installed.

In an implementation form of an apparatus according to the first aspect, the conduit arrangement forms a space sealed off from the ambient air surrounding the apparatus.

In an implementation form of an apparatus according to the first aspect, the conduit arrangement is configured such that a vapour of the fluid travels from the boiling region to the condensation region.

In an implementation form of an apparatus according to the first aspect, the conduit arrangement is configured such that heat is carried by the fluid from the boiling region to the condensation region.

In an implementation form of an apparatus according to the first aspect, the heat sink comprises the heat sink base, wherein the one or more fins is/are connected or connectable to the heat sink base.

According to a second aspect of the present application, the above-mentioned and other objects are achieved with a network access node for a wireless communication system, wherein the network access node comprises an apparatus according to any of the embodiments or implementation forms of the apparatus mentioned above or below. Advantages of the network access node correspond to the advantages of the apparatus and its implementation forms or embodiments mentioned above or below. The network access node may comprise, or be, a unit located in a base station.

Further applications and advantages of the implementation forms or embodiments of the present application will be apparent from the following detailed description.

BRIEF DESCRIPTION OF THE DRAWINGS

The appended drawings are intended to clarify and explain different embodiments of the invention, in which:

FIG. 1A is a schematic side view of the apparatus according to the first aspect of the invention and of the fin of the apparatus illustrating aspects and definitions of embodiments of the apparatus according to the first aspect;

FIG. 1B is an enlargement of the fin of FIG. 1A illustrating aspects and definitions of embodiments of the apparatus according to the first aspect and of the boiling chamber of the fin;

FIGS. 2A-G are schematic side views of the apparatus according to the first aspect of the present application and of the fin of the apparatus illustrating different embodiments of the vapour guiding path of the fin;

FIGS. 6A-B are schematic side views illustrating embodiments of the apparatus according to the first aspect and based on aspects and definitions of FIG. 4A but also based on aspects and definitions of FIGS. 1A-B;

FIGS. 8A-C are schematic side views of embodiments of the apparatus according to the first aspect;

FIG. 10A is a schematic side view of a fin of an embodiment of the apparatus according to the first aspect;

FIG. 10B is a schematic side view of a fin of an embodiment of the apparatus according to the first aspect;

FIG. 13 is a schematic side view of a fin of an embodiment of the apparatus according to the first aspect;

FIG. 14 is a schematic side view of a fin of another embodiment of the apparatus according to the first aspect;

FIG. 15 is a schematic rear view of an embodiment of the apparatus according to the first aspect; and FIG. 16 is a schematic top view of an embodiment of the apparatus according to the first aspect.

DETAILED DESCRIPTION

Figure 2G:
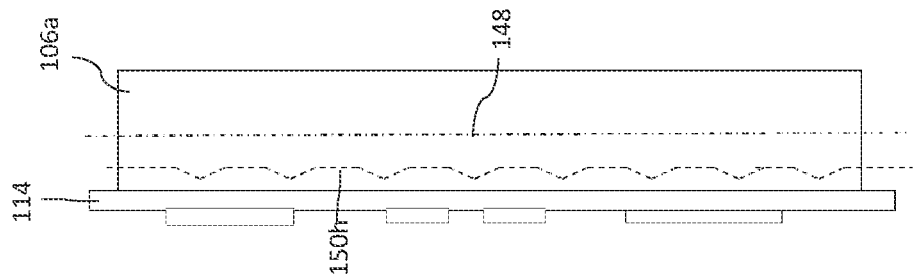

With reference to FIGS. 1A to 4B, 15 and 16, aspects and definitions of embodiments of the apparatus 100a-d for transferring heat from a heat source 102 to air when the apparatus 100a-d is connected to the heat source 102 according to the first aspect and aspects and definitions of the boiling, or evaporation, chamber 104b-d of a fin 106a-d of the apparatus 100a-d are schematically illustrated.

With reference to FIGS. 1A to 4B, 15 and 16, in the illustrated embodiments, the heat source 102 is an electric or electronic component 108, which may be attached or mounted to a printed circuit board (PCB) 110. The electric or electronic component 108 may be a transmitter, an optical transducer, a power amplifier, or any other heat-generating component, or any other heat-generating electric or electronic component. However, it is to be understood that the heat source 102 in other embodiments may be a component not mounted to a PCB 110 or may comprise any other heat source 102. In the illustrated embodiments, a plurality of heat sources 102 are present. For example, the heat source 102 or heat sources 102, and for example also the PCB 110, may be a part of a network access node for a wireless communication system. The network access node may comprise a unit located in, and/or being part of, a base station.

With reference to FIGS. 1A to 4B, 15 and 16, the apparatus 100a-d includes a heat sink 112 including multiple, or several, fins 106a-d connected or connectable to a heat sink base 114 configured to be thermally coupled to the heat source 102. The heat sink base 114 has a longitudinal extension 116 configured to extend in a vertical direction 118 when the apparatus 100a-d is installed.

With reference to FIGS. 1A to 4B, each or at least one of the fins 106a-d is configured as follows. The fin 106a-d includes a conduit arrangement 120b-d comprising one or more conduits 122a-c enclosing, or configured to enclose, a heat-carrying fluid. The fluid may comprise or consist of a liquid, a vapour, and/or a mixture thereof. In general, during operation, the one or more conduits 122a-c encloses/enclose both liquid and vapour. The fin 106a-d, or the conduit arrangement 120b-d, includes a boiling, or evaporation, region 124 and a condensation region 126 through which the heat-carrying fluid is conveyed. The fin 106a-d is connected or connectable to the heat sink base 114 such that the boiling region 124 is positioned between the heat sink base 114 and the condensation region 126. Thus, when the fin 106a-d is connected to the heat sink base 114, the boiling region 124 is positioned between the heat sink base 114 and the condensation region 126. The fin 106a-d includes a bottom portion 128a-d and a top portion 130a-d. The fin 106a-d has a longitudinal extension 132a-d extending from the bottom portion 128a-d to the top portion 130a-d. The fin 106a-d is connected or connectable to the heat sink base 114 such that the longitudinal extension 132a-d of the fin 106a-d extends in the direction 134 of the longitudinal extension 116 of the heat sink base 114.

With reference to FIGS. 1A to 4B, in the boiling region 124 the conduit arrangement 120b-d includes a vapour guiding path 136a-d. The vapour guiding path 136a-d has a longitudinal extension 138b-d extending in the direction 134 of the longitudinal extension 132a-d of the fin 106a-d. In the boiling region 124 the conduit arrangement 120b-d includes one or more, such as two or more, boiling chambers 104b-d in which at least a portion of the fluid boils and/or evaporates. The boiling chamber 104b-d has an outer boundary 142b-d.

With reference to FIG. 1B, which illustrates an enlargement of the region 144 of the fin 106a of FIG. 1A, and FIGS. 3A and 4A, the general aspects and definitions of the boiling chamber 104b-d are defined as follows: The boiling chamber 104b-d is located within, or inside, a chamber region R defined (or limited, or restricted) by an imaginary quadrilateral Q having four sides AB, BC, DC, AD and four vertices A, B, C, D, or four corners A, B, C, D. A first vertex A and a second vertex D of the four vertices A, B, C, D are located on the vapour guiding path 136a-d. A third vertex B and a fourth vertex C of the four vertices A, B, C, D are displaced from the vapour guiding path 136a-d, i.e., are not located on the vapour guiding path 136a-d. The first vertex A is located between the top portion 130a-d of the fin 106a-d and each one of the second, third and fourth vertices B, C, D. The third vertex B is located between the top portion 130a-d of the fin 106a-d and the fourth vertex C. The second vertex D is located between the top portion 130a-d of the fin 106a-d and the fourth vertex C. The side AB of the imaginary quadrilateral Q extending from the first vertex A to the third vertex B has, or shares, one or more tangent points P1 (for some embodiments, an infinite number of tangent points) with (or on) the outer boundary 142b-d of the boiling chamber 104b-d. The side DC of the imaginary quadrilateral Q extending from the second vertex D to the fourth vertex C has one or more tangent points P2 (for some embodiments, an infinite number of tangent points) with the outer boundary 142b-d of the boiling chamber 104b-d. The boiling chamber 104b-d is connected to the vapour guiding path 136a-d via one or more orifices 146b-d, or passages, mouths, or openings. Otherwise, for embodiments of the apparatus 100a-d, the boiling chamber 104b-d, and/or the outer boundary 142b-d of the boiling chamber 104b-d, may be defined, or formed, by any type or types of lines, curves, or arcs etc., inside the chamber region R or the imaginary quadrilateral Q. By way of these general aspects and definitions of the boiling chamber 104b-d, an efficient heat transfer by way of the heat-carrying fluid is provided, whereby the heat source, for example an electric or electronic component, and/or the area around the heat source, are/is efficiently cooled.

Figure 3B:
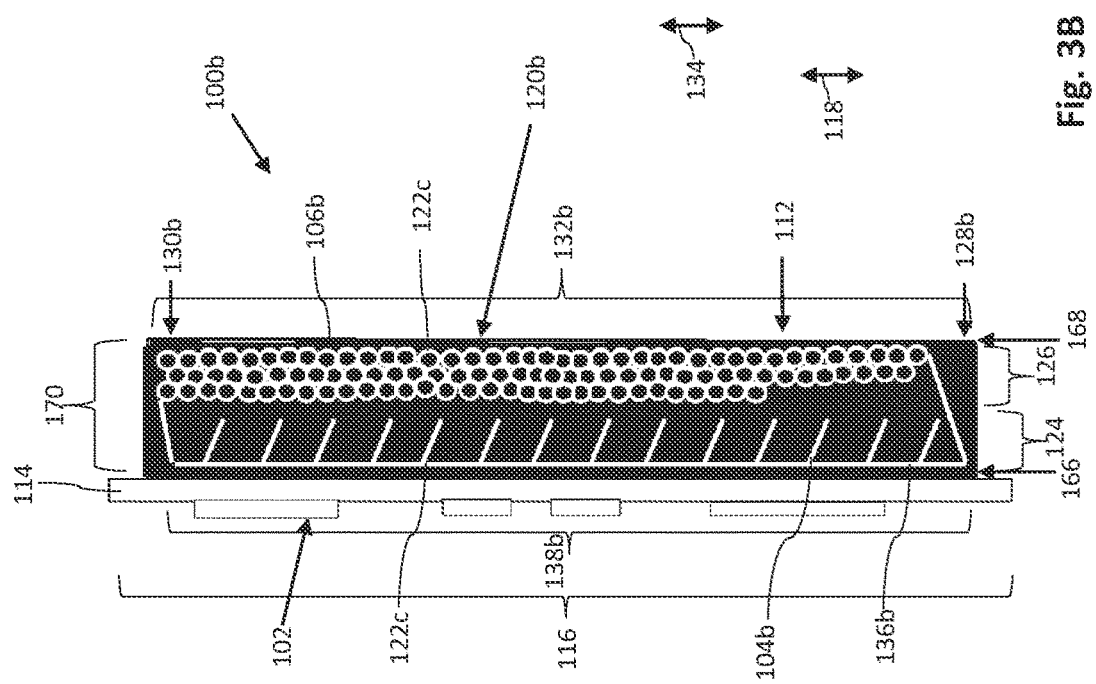
FIG. 3B is a schematic side view of an embodiment of the apparatus according to the first aspect and based on aspects and definitions of FIG. 3A but also based on aspects and definitions of FIGS. 1A-B.
Figure 3A:
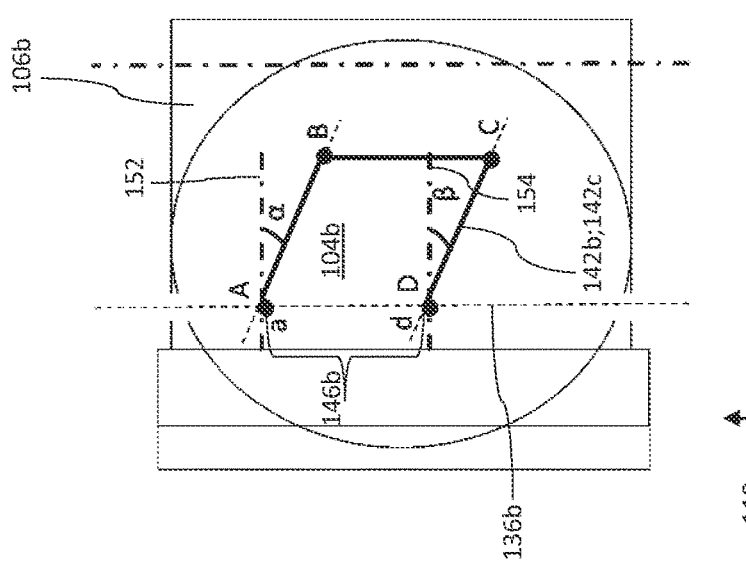
FIG. 3A is a schematic side view of a portion of a fin of the apparatus according to the first aspect of the present application illustrating aspects and definitions of embodiments of the apparatus according to the first aspect and of the boiling chamber of the fin.
Figure 4B:
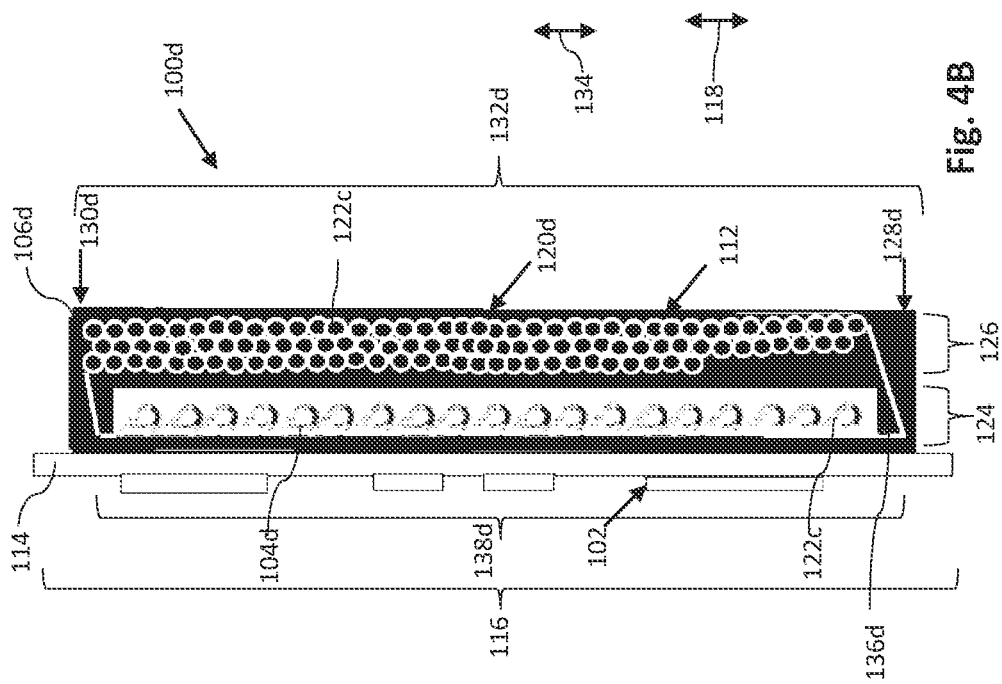
FIG. 4B is a schematic side view of an embodiment of the apparatus according to the first aspect and based on aspects and definitions of FIG. 4A but also based on aspects and definitions of FIGS. 1A-B.
Figure 4A:
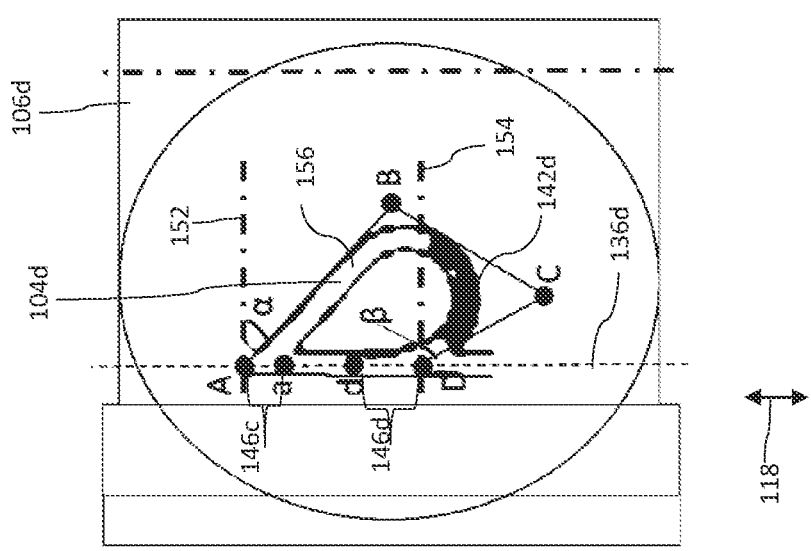
FIG. 4A is a schematic side view of a portion of a fin of the apparatus according to the first aspect of the present application illustrating aspects and definitions of embodiments of the apparatus according to the first aspect and of the boiling chamber of the fin.

With reference to FIGS. 1B, 3A and 4A, for embodiments of the apparatus 100a-d, it may be defined that, when the longitudinal extension 132a-d of the fin 106a-d extends in the vertical direction 118, the first vertex A is located above each one of the second, third and fourth vertices B, C, D; the third vertex B is located above the fourth vertex C; and the second vertex D is located above the fourth vertex C.

With reference to FIGS. 1 A and 2A to 2G, for some embodiments, the boiling region 124 and the condensation region 126 may be separated by a boiling-condensation region boundary 148, which may be an imaginary straight line, which may extend in the direction 134 of the longitudinal extension 132a-d of the fin 106a-d. For some embodiments, the longitudinal extension 138b-d of the vapour guiding path 136a-d may follow, or extend along, an imaginary boiling channel guiding line 150a-h. For some embodiments, the imaginary boiling channel guiding line 150a-h may extend substantially in the direction 134 of the longitudinal extension 132a-d of the fin 106a-d. In FIGS. 1A and 2A to 2G, different alternatives of the imaginary boiling channel guiding line 150a-h are schematically illustrated. With reference to FIG. 1A, for some embodiments, the imaginary boiling channel guiding line 150a may be a straight line substantially in parallel to the longitudinal extension 132a-d of the fin 106a-d.

With reference to FIG. 2A, for some embodiments, the imaginary boiling channel guiding line 150b may be a straight line inclined in such a way that the bottom of the imaginary boiling channel guiding line 150b is located closer to the boiling-condensation region boundary 148 than the top of the imaginary boiling channel guiding line 150b is. Alternatively, when the fin 106a-d is connected to the heat sink base 114, the imaginary boiling channel guiding line 150b may be inclined in such a way that the top of the imaginary boiling channel guiding line 150b is located closer to the heat sink base 114 than the bottom of the imaginary boiling channel guiding line 150b is.

With reference to FIG. 2B, for some embodiments, the imaginary boiling channel guiding line 150c may be a straight line inclined in such a way that the top of the imaginary boiling channel guiding line 150c is located closer to the boiling-condensation region boundary 148 than the bottom of the imaginary boiling channel guiding line 150b is. Alternatively, when the fin 106a-d is connected to the heat sink base 114, the imaginary boiling channel guiding line 150c may be inclined in such a way that the bottom of the imaginary boiling channel guiding line 150c is located closer to the heat sink base 114 than the top of the imaginary boiling channel guiding line 150c is.

With reference to FIG. 2C, for some embodiments, the imaginary boiling channel guiding line 150d may be a spline line successively approaching closer to the boiling-condensation region boundary 148 and closer to the heat sink base 114 in alternating manner, while extending along the longitudinal extension 132a-d of the fin 106a-d.

With reference to FIG. 2D, for some embodiments, the imaginary boiling channel guiding line 150e may comprise two straight lines intersecting in the boiling region 124, wherein the vertex of the two straight lines is directed toward, or points to, the boiling-condensation region boundary 148 or the condensation region 126, or points away from the heat sink base 114 when the fin 106a-d is connected to the heat sink base 114.

Figure 2F:
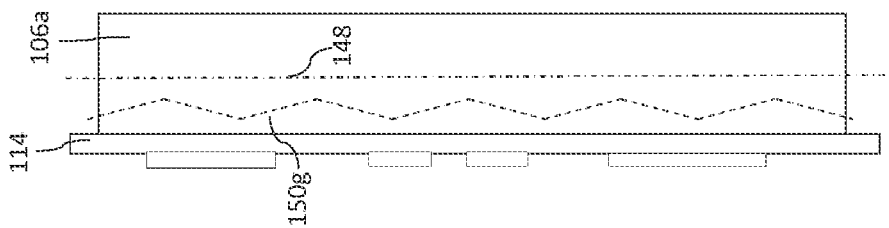
Figure 2E:
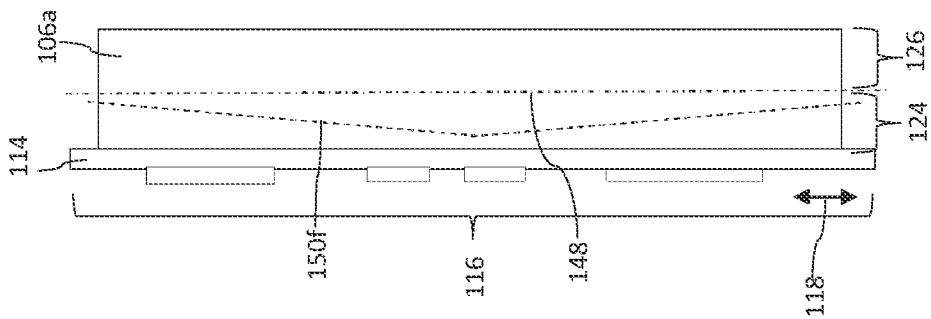

With reference to FIG. 2E, for some embodiments, the imaginary boiling channel guiding line 150f may comprise two straight lines intersecting in the boiling region 124, wherein the vertex the two straight lines points away from the boiling-condensation region boundary 148 or the condensation region 126, or points to the heat sink base 114 when the fin 106a-d is connected to the heat sink base 114.

With reference to FIG. 2F, for some embodiments, the imaginary boiling channel guiding line 150g may comprise multiple intersecting straight lines intersecting in the boiling region 124, wherein the vertices of the multiple intersecting straight lines successively point away from and point to the boiling-condensation region boundary 148, or the condensation region 126, in alternating manner.

With reference to FIG. 2G, for some embodiments, the imaginary boiling channel guiding line 150h may comprise multiple intersecting straight lines intersecting in the boiling region 124 and being connected by straight lines extending substantially in parallel to the longitudinal extension 132a-d of the fin 106a-d, wherein the vertices of the multiple intersecting straight lines point away from, or point to, the boiling-condensation region boundary 148. For alternative embodiments, the vertices of the multiple intersecting straight lines may successively point away from and point to the boiling-condensation region boundary 148 in alternating manner. It is to be understood that other imaginary boiling channel guiding lines different from the imaginary boiling channel guiding lines 150a-h illustrated in FIGS. 1A and 2A to 2G are possible.

With reference to FIGS. 1B, 3A and 4A, for some embodiments, the boiling chamber 104b-d may comprise a fifth vertex a and a sixth vertex d limiting the one or more orifices 146b-d. The fifth and sixth vertices a, d are located on the vapour guiding path 136a-d. The fifth vertex a is located between the first vertex A and the second vertex D or at the position of the first vertex A. The sixth vertex d is located between the first vertex A and the second vertex D or at the position of the second vertex D.

Figure 3C:
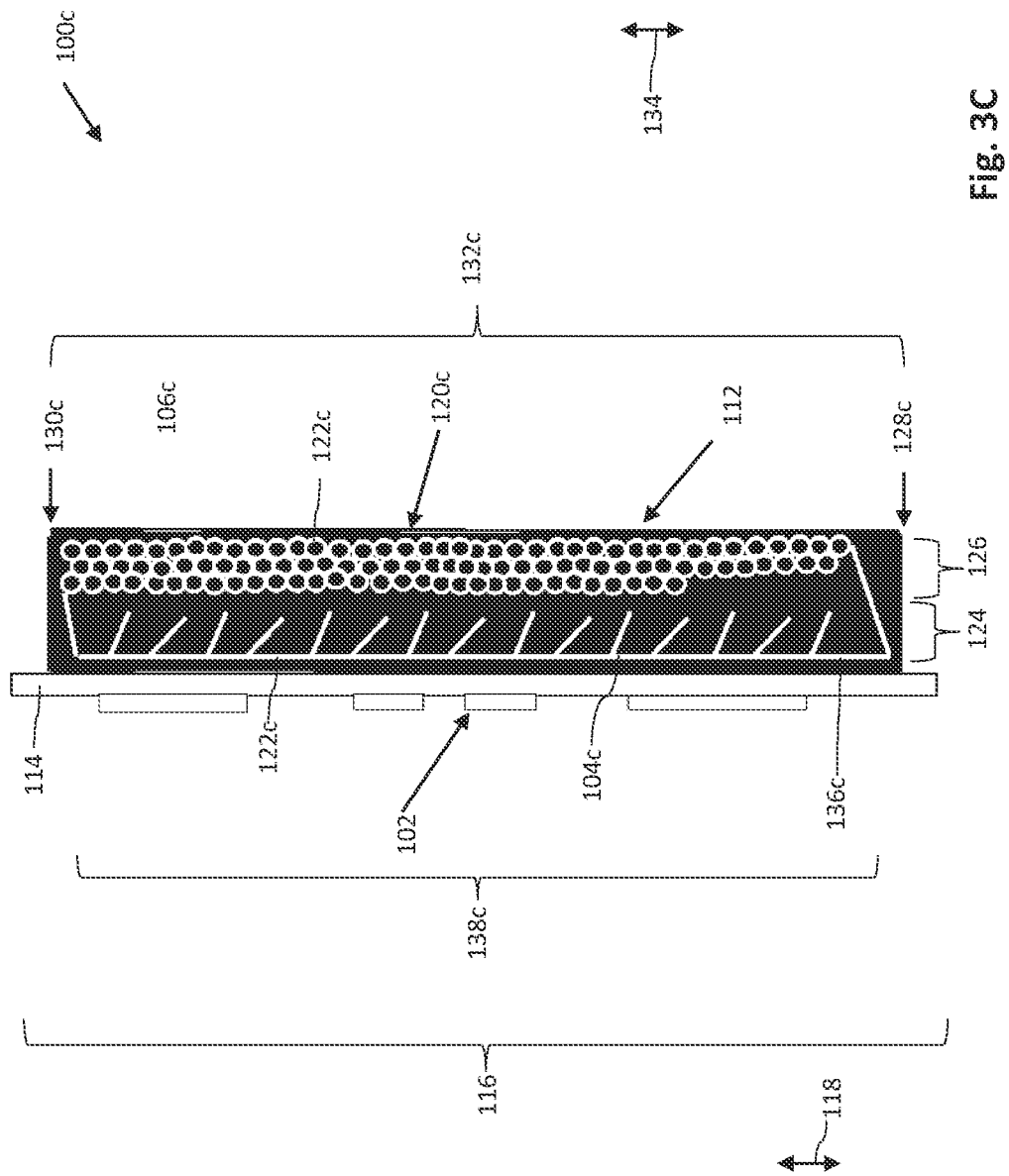
FIG. 3C is a schematic side view of another embodiment of the apparatus according to the first aspect and based on aspects and definitions of FIG. 3A-B but also based on aspects and definitions of FIGS. 1A-B.

With reference to FIG. 3A, for some embodiments, the boiling chamber 104b-c may be connected to the vapour guiding path 136b-c via one orifice 146b, wherein the fifth vertex a is located at the position of the first vertex A, wherein the sixth vertex d is located at the position of the second vertex D, and wherein the fifth and sixth vertices a, d limit (or restrict, or define) the orifice 146b. With reference to FIGS. 3A to 3C, for some embodiments, the boiling chamber 104b-c may have a substantially rectangular shape, for example in the plane of the fin 106b-c and/or when viewed in a direction transverse to the direction 134 of the longitudinal extension 132b-c of the fin 106b-c.

With reference to FIG. 3B, for some embodiments, the acute angels formed between the longitudinal extension of the rectangular boiling chambers 104b and a horizontal axis may be substantially equal to one another. However, with reference to FIG. 3C, for other embodiments, the acute angels formed between the longitudinal extension of the rectangular boiling chambers 104c and a horizontal axis may differ from one another. For some embodiments, the length of the side AB of the imaginary quadrilateral Q extending from the first vertex A to the third vertex B and the length of the side DC of the imaginary quadrilateral Q extending from the second vertex D to the fourth vertex C may be equal to one another, or may be differ from one another.

With reference to FIG. 4A, for some embodiments, the boiling chamber 104d may be connected to the vapour guiding path 136d via two orifices 146c-d, wherein the fifth and sixth vertices a, d are located between the first vertex A and the second vertex D, and wherein the first and fifth vertices A, a limit (or restrict, or define) one 146c of the two orifices 146c-d while the second and sixth vertices D, d limit the other one 146d of the two orifices 146c-d.

With reference to FIGS. 1B, 3A and 4A, for some embodiments, further aspects and definitions of the boiling chamber 104b-d may be defined as follows: The acute angle α formed between (or by) the side AB of the imaginary quadrilateral Q extending from the first vertex A to the third vertex B and a first axis 152 (an imaginary first axis), which intersects the first vertex A and is perpendicular to the direction 134 of the longitudinal extension 132a-d of the fin 106a-d, is greater than zero degrees and less than or equal to 90 degrees, i.e., is in the range of zero to 90 degrees, including the end point of 90 degrees.

With reference to FIGS. 1B, 3A and 4A, for some embodiments, further aspects and definitions of the boiling chamber 104b-d may be defined as follows: The acute angle θ formed between the side DC of the imaginary quadrilateral Q extending from the second vertex D to the fourth vertex C and a second axis 154 (an imaginary second axis), which intersects the second vertex D and is perpendicular to the direction 134 of the longitudinal extension 132a-d of the fin 106a-d, is greater than zero degrees and less than or equal to 90 degrees, i.e., is in the range of zero to 90 degrees, including the end point of 90 degrees.

With reference to FIG. 3A, for some embodiments, the acute angle α formed between the side AB of the imaginary quadrilateral Q extending from the first vertex A to the third vertex B and the first axis 152 is equal to the acute angle R formed between the side DC of the imaginary quadrilateral Q extending from the second vertex D to the fourth vertex C and the second axis 154.

With reference to FIG. 3A, for some embodiments, the length of the side AB of the quadrilateral Q extending from the first vertex A to the third vertex B multiplied by the cosine of the acute angle α formed between the side AB of the imaginary quadrilateral Q extending from the first vertex A to the third vertex B and the first axis 152 is equal to the length of the side DC of the imaginary quadrilateral Q extending from the second vertex D to the fourth vertex C multiplied by the cosine of the acute angle R formed between the side DC of the imaginary quadrilateral Q extending from the second vertex D to the fourth vertex C and the second axis 154.

With reference to FIG. 4A, for some embodiments, the acute angle α formed between the side AB of the imaginary quadrilateral Q extending from the first vertex A to the third vertex B and the first axis 152 is greater than the acute angle R formed between the side DC of the imaginary quadrilateral Q extending from the second vertex D to the fourth vertex C and the second axis 154.

With reference to FIG. 4A, for some embodiments, the length of the side AB of the imaginary quadrilateral Q extending from the first vertex A to the third vertex B multiplied by the cosine of the acute angle α formed between the side AB of the imaginary quadrilateral Q extending from the first vertex A to the third vertex B and the first axis 152 is greater than the length of the side DC of the imaginary quadrilateral Q extending from the second vertex D to the fourth vertex C multiplied by the cosine of the acute angle R formed between the side DC of the imaginary quadrilateral Q extending from the second vertex D to the fourth vertex C and the second axis 154.

With reference to FIGS. 1B, 3A and 4A, for some embodiments, further aspects and definitions of the boiling chamber 104b-d may be defined as follows: The side BC of the imaginary quadrilateral Q extending from the third vertex B to the fourth vertex C has one or more tangent points P3 (for some embodiments, an infinite number of tangent points) with the outer boundary 142b-d of the boiling chamber 104b-d.

With reference to FIG. 4A, for some embodiments, boiling chamber 104d may include a conduit loop 156 having two orifices 146c-d. For some embodiments, it may be defined that the boiling chamber 104d is configured to trap fluid in liquid form transported by a stream of fluid in vapour form flowing in the vapour guiding path 136a-d in the direction 134 of the longitudinal extension 132d of the fin 106d. For some embodiments, the boiling chamber 104d configured to trap fluid in liquid form may be referred to as a fluid diode.

With reference to FIGS. 1A to 4B, for some embodiments, the side AD of the imaginary quadrilateral Q extending from the first vertex A to the second vertex D may extend in the direction 134 of the longitudinal extension 138b-d of the vapour guiding path 136a-d. For some embodiments, the imaginary quadrilateral Q may be located in a vertical plane when the fin 106a-d is connected to the heat sink base 114. For some embodiments, it may be defined that the orifice 146c-d is positioned on the side AD of the imaginary quadrilateral Q extending from the first vertex A to the second vertex D.

With reference to FIGS. 1A to 4B, for some embodiments, the longitudinal extension 138b-d of the vapour guiding path 136a-d may extend from the bottom portion 128a-d to the top portion 130a-d of the fin 106a-d, for example along substantially the entire the longitudinal extension 132a-d of the fin 106a-d. However, with reference to FIG. 13, for some embodiments, the longitudinal extension 138x of the vapour guiding path 136x of the fin 106x may extend only along a portion, or section, of the longitudinal extension 132x of the fin 106x.

Figure 5B:
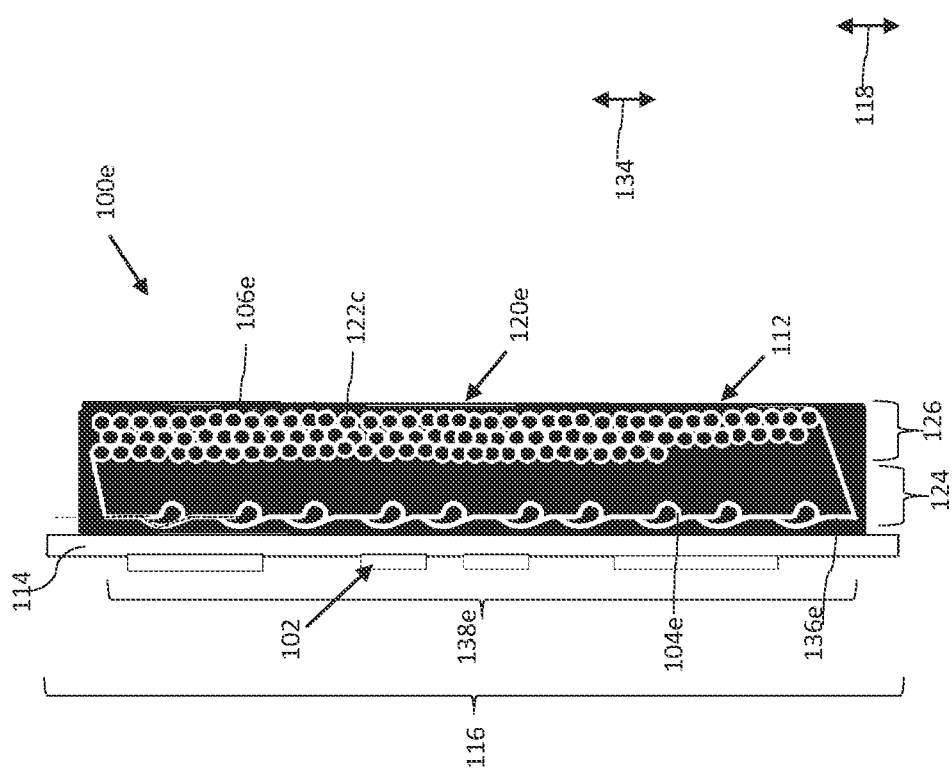
FIGS. 5A-B are schematic side views illustrating embodiments of the apparatus according to the first aspect and based on aspects and definitions of FIG. 4A but also based on aspects and definitions of FIGS. 1A-B.
Figure 5A:
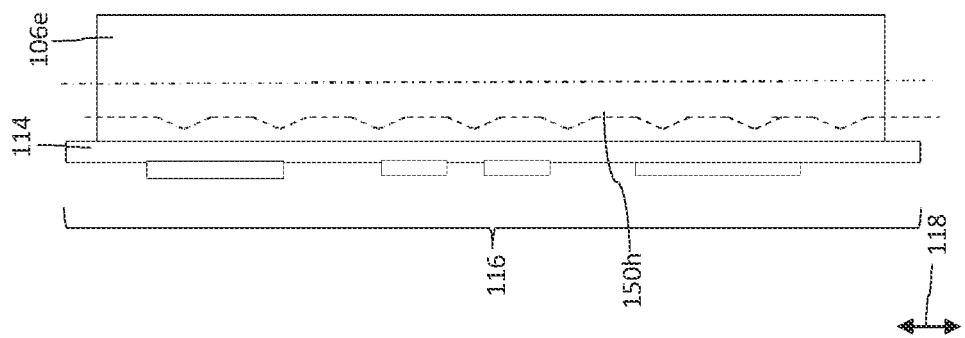

With reference to FIGS. 5A and 5B, another embodiment of the apparatus 100e according to the first aspect is schematically illustrated. The longitudinal extension 138e of the vapour guiding path 136e follows, or extends along, the imaginary boiling channel guiding line 150h illustrated in FIG. 5A, which corresponds to the imaginary boiling channel guiding line 150h of FIG. 2G. Each boiling chamber 104e of the fin 106e of the apparatus 100e of FIG. 5B is drop-shaped and may be positioned on any one of the lateral sides of the vapour guiding path 136e or of the imaginary boiling channel guiding line 150h, i.e. positioned between the imaginary boiling channel guiding line 150h and the heat sink base 114, or positioned between the imaginary boiling channel guiding line 150h and the condensation region 126. It is to be understood that many other shapes of the boiling chamber different from the shapes of the boiling chambers 104b-e disclosed above or below are possible.

With reference to FIGS. 6A and 6B, another embodiment of the apparatus 100f according to the first aspect is schematically illustrated. The longitudinal extension 138f of the vapour guiding path 136f follows, or extends along, the imaginary boiling channel guiding line 150g illustrated in FIG. 6A, which corresponds to the imaginary boiling channel guiding line 150g of FIG. 2F. Each boiling chamber 104d of the fin 106f of the apparatus 100f of FIG. 6B corresponds to the boiling chamber 104d of FIG. 4A. In contrast to the boiling chambers 104d of FIG. 4B, the boiling chambers 104d of FIG. 6B are located on both lateral sides of the vapour guiding path 136f or of the imaginary boiling channel guiding line 150g, i.e. some of the boiling chambers 104d of FIG. 6B are positioned between the imaginary boiling channel guiding line 150g and the heat sink base 114 while others of the boiling chambers 104d of FIG. 6B are positioned between the imaginary boiling channel guiding line 150g and the condensation region 126, for example in an in alternating manner, i.e., one of the boiling chambers 104d of FIG. 6B positioned between the imaginary boiling channel guiding line 150g and the heat sink base 114 may be followed by another one of the boiling chambers 104d of FIG. 6B positioned between the imaginary boiling channel guiding line 150g and the condensation region 126.

Figure 7B:
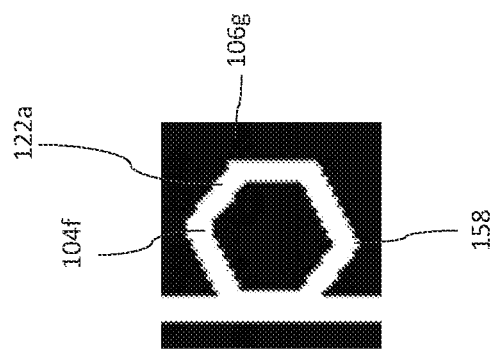
FIG. 7B is an enlargement of a boiling chamber of the fin of FIG. 7A.
Figure 7A:
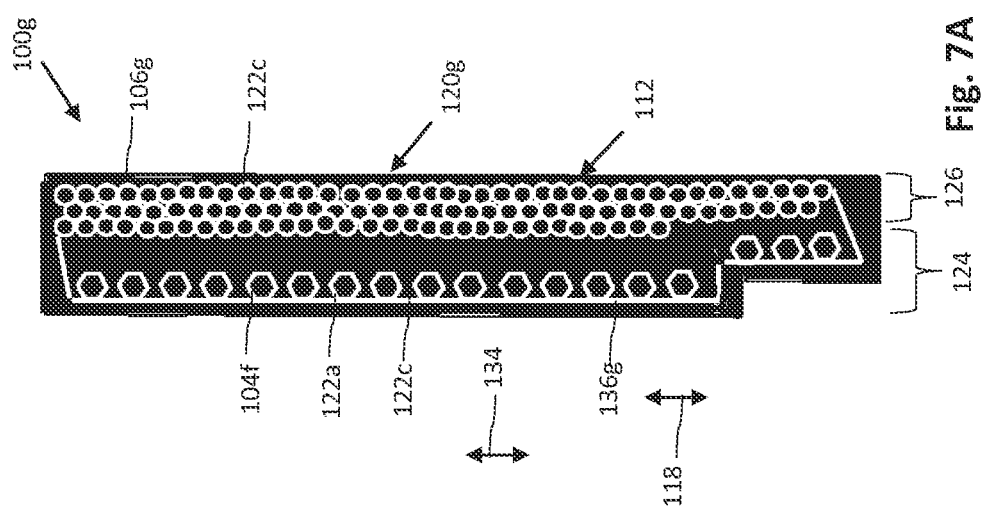
FIG. 7A is a schematic side view of a fin of an embodiment of the apparatus according to the first aspect and based on aspects and definitions of FIG. 4A but also based on aspects and definitions of FIGS. 1A-B.

With reference to FIGS. 7A and 7B, for some embodiments, each or at least one of the boiling chambers 104f of the fin 106g of the apparatus 100g comprises a hexagonal conduit 122a. For some embodiments, it may be defined that the hexagonal conduit 122a has an outer boundary 158. The outer boundary 158 of the hexagonal conduit 122a has six vertices and six sides. One of the six sides of the outer boundary of the hexagonal conduit 122a may be aligned with the vapour guiding path 136g.

Figure 8B:
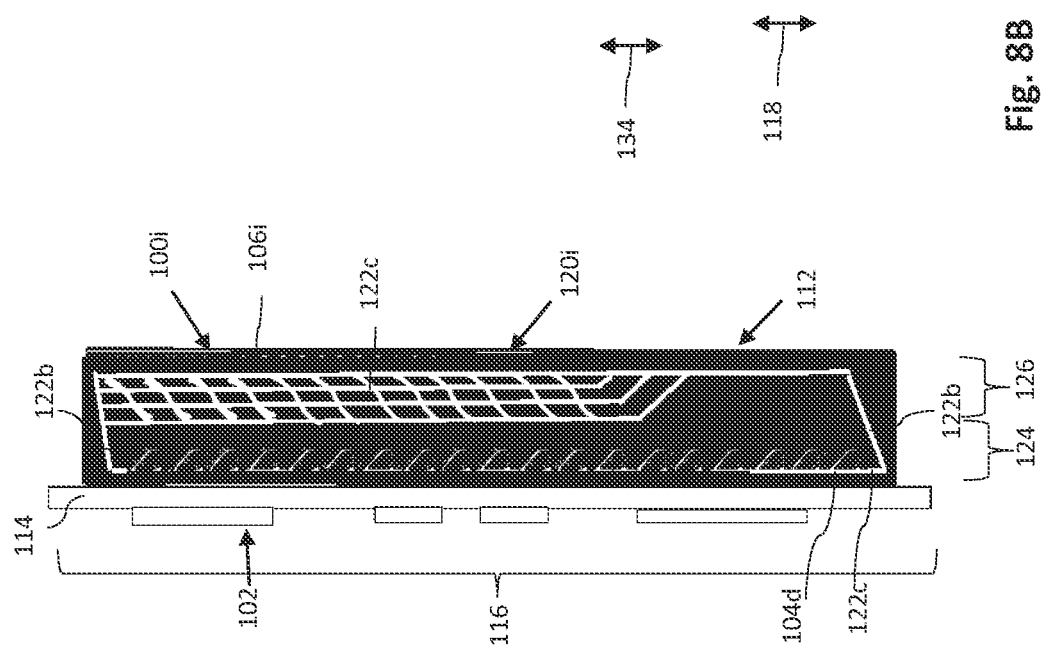
Figure 8A:
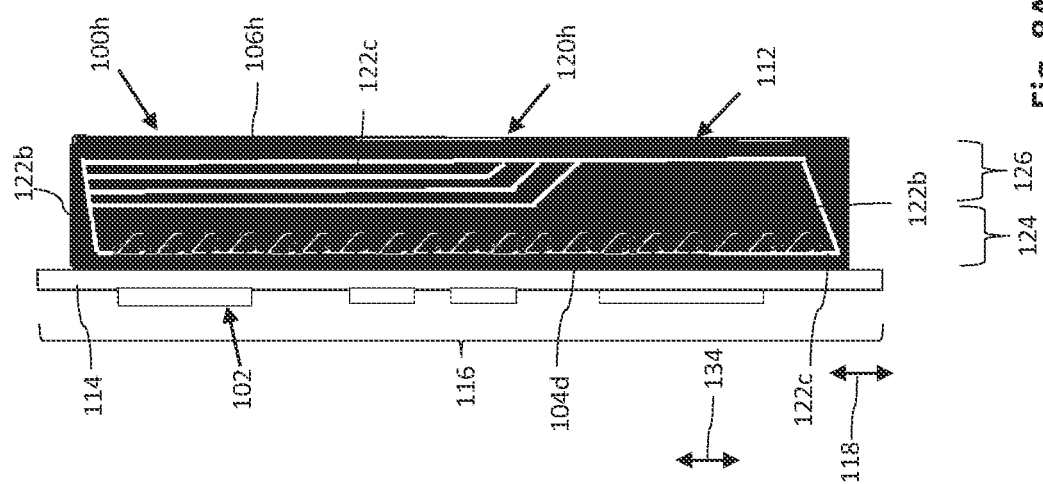

With reference to FIGS. 8A to 8C, for some embodiments, the conduit arrangement 120h-j of the fin 106h-j of the apparatus 100h-j includes two or more interconnection conduits 122b connecting the one or more conduits 122c of the boiling region 124 to the one or more conduits 122c of the condensation region 126. With reference to FIG. 8C, for some embodiments, it may be defined that each or at least one of the interconnection conduits 122b has one or more longitudinal extensions 160, wherein an acute angle α2 is formed between the longitudinal extension 160 the of interconnection conduit 122b and an axis 162 perpendicular to the direction 134 of the longitudinal extension 132j of the fin 106j.

Figure 9B:
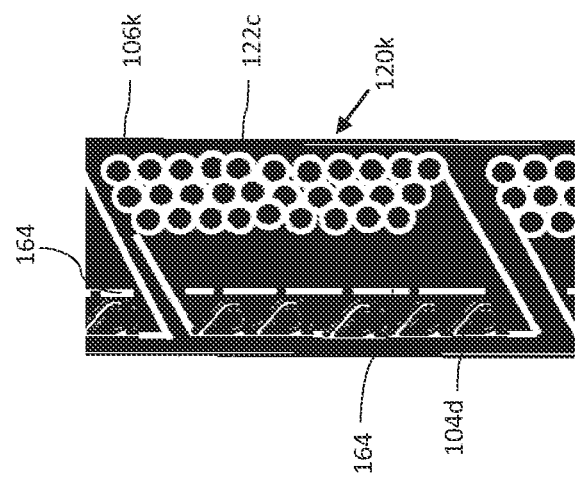
FIG. 9B is an enlargement of a portion of the fin of FIG. 9A.
Figure 9A:
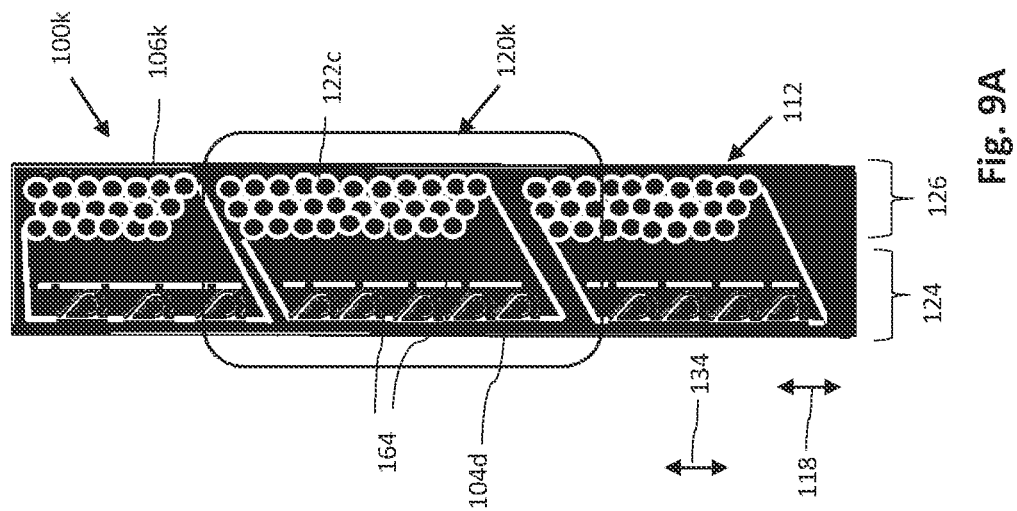
FIG. 9A is a schematic side view of a fin of an embodiment of the apparatus according to the first aspect.

With reference to FIGS. 9A and 9B, for some embodiments, the fin 106k may form one or more through-holes 164, or slits, for air to pass through. Each through-hole 164 is located between the boiling chambers 104d and the condensation region 126. The through-holes 164 provide a reduction of the heat load, which is applied from the lateral side of the fin 106k, covered by thermal conduction. The conduction path is cut off by the through-holes 164, which act as thermal insulation regions. Thus, more heat load is covered by the heat-carrying fluid, which has a higher thermal efficiency in heat transfer rate than thermal conduction. This results in a lower temperature of the heat sources 102 cooled by the heat sink 112, or results in a higher heat load dissipation without increasing temperatures of the heat sources 102, within the given boundaries.

With reference to FIGS. 10A and 10B, for some embodiments, the fin 106l-m may include two or more conduit arrangements 120l-q.

Figure 11:
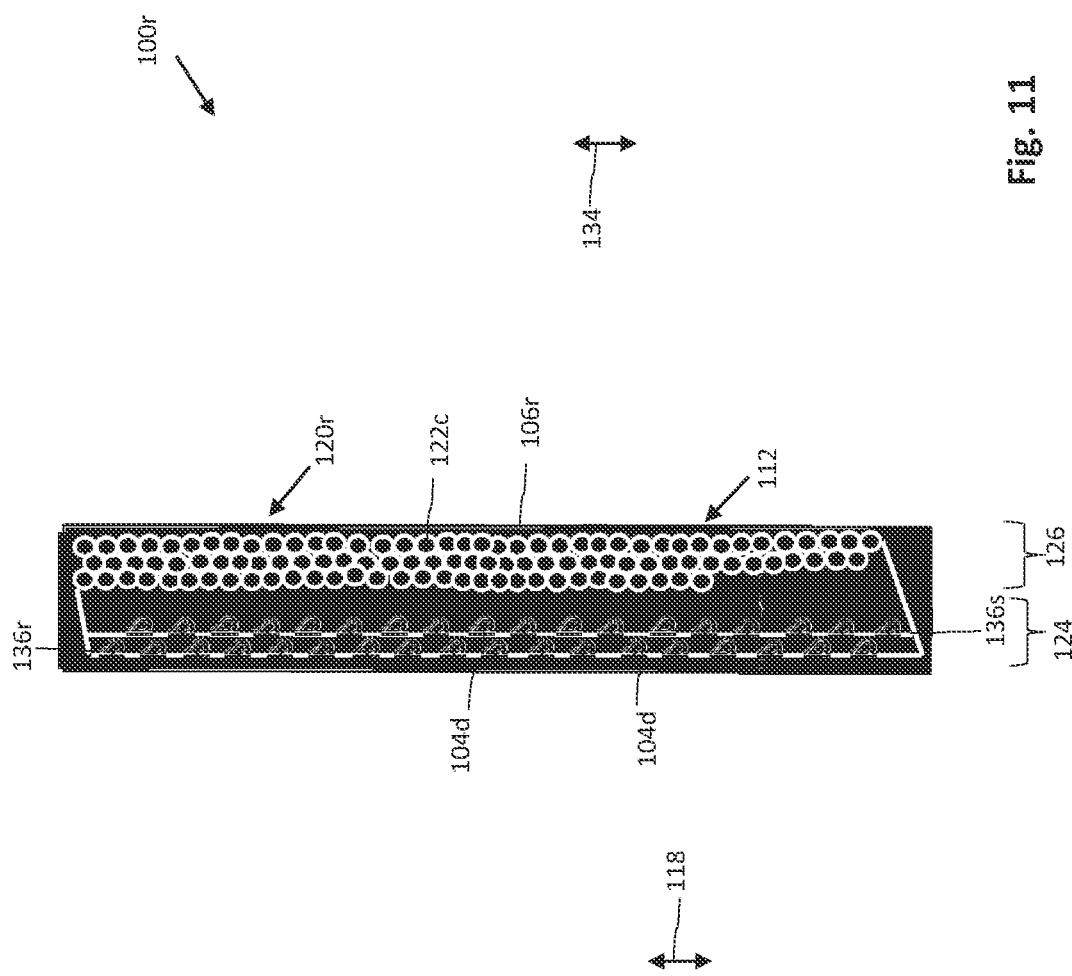
FIG. 11 is a schematic side view of a fin of an embodiment of the apparatus according to the first aspect.
Figure 12B:
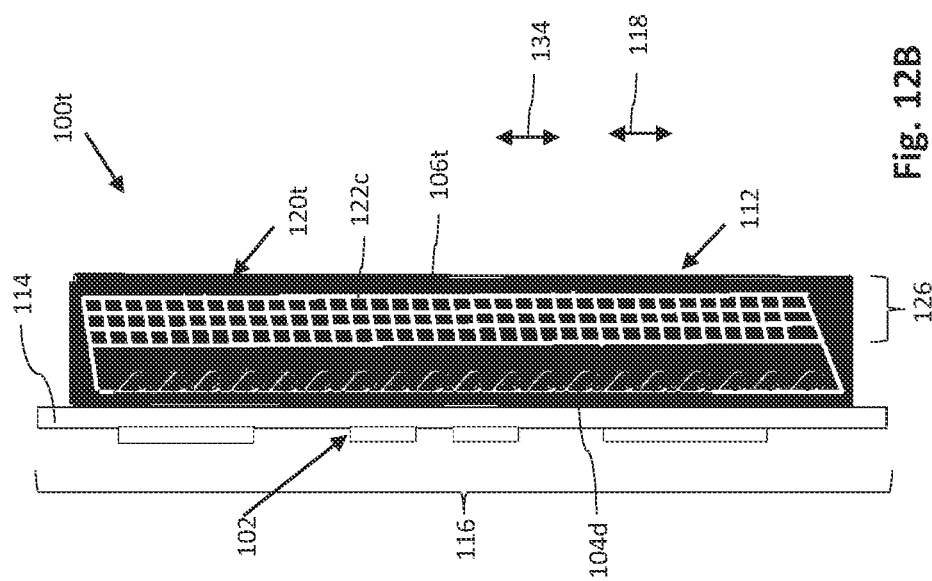
FIGS. 12A-C are schematic side views of embodiments of the apparatus according to the first aspect.
Figure 12A:
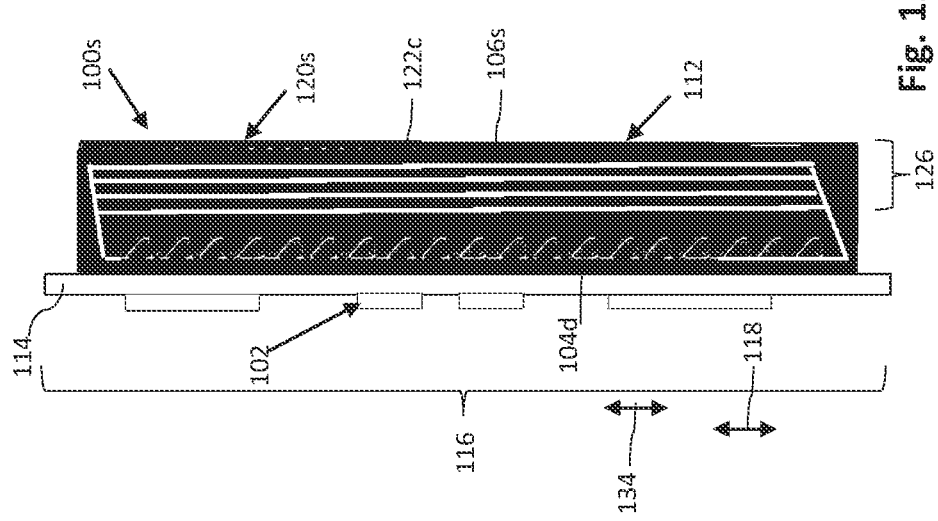
Figure 12D:
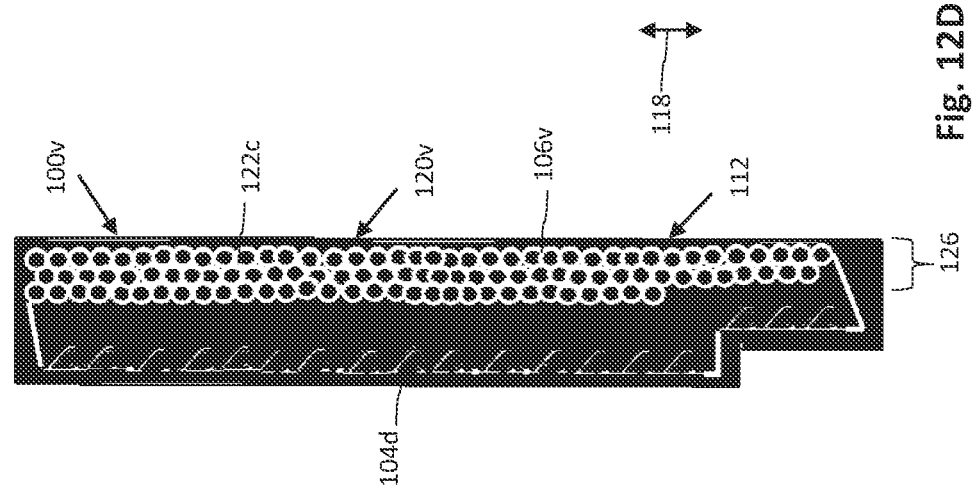
FIG. 12D is a schematic side view of a fin of an embodiment of the apparatus according to the first aspect.
Figure 12C:
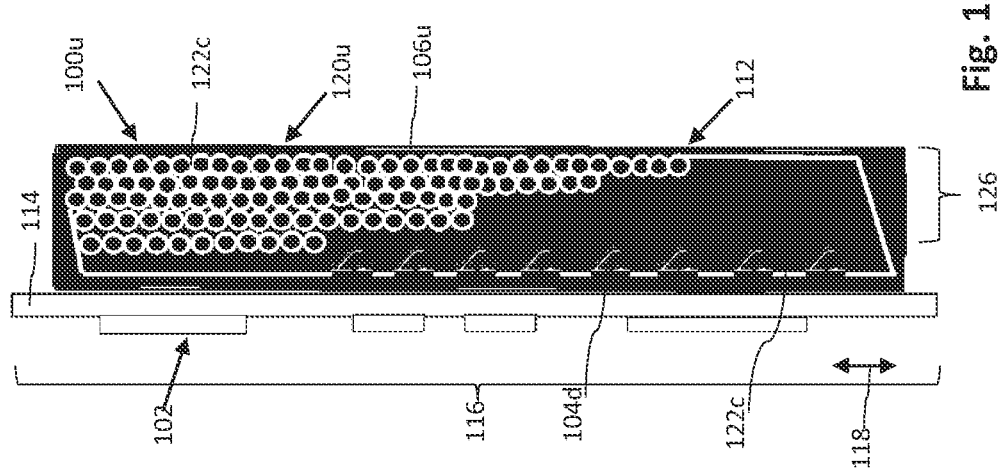

With reference to FIG. 11, for some embodiments, in the boiling region 124 the conduit arrangement 120r of the fin 106r may include two or more parallel vapour guiding paths 136r-s.

With reference to FIGS. 3B to 12D, for some embodiments, in the condensation region 126 the conduits 122c of the conduit arrangement 120b-v may include, or form, one or more of the group of.
    a hexagonal conduit 122c;
    an annular conduit 122c;
    a circular conduit 122c;
    an oval conduit 122c;
    a mesh-shaped conduit system 120t;
    a straight conduit 122c; and
    a straight conduit 122c having a longitudinal extension extending in the direction of the longitudinal extension of the fin 106s-u.

With reference to FIG. 14, for some embodiments, the boiling chambers 104d of the fin 106y may be spaced apart from one another and may be connected, such as fluidly connected, to one another by one or more conduits 122c, for example one or more straight conduits 122c.

With reference to FIGS. 1 to 16, for some embodiments, the fin 106a-y may be formed from one or more plates (such as sheet metals) made of a material, which comprises or consists of a metal or a metal alloy, by way of press forming, such as hot press forming, or cold forming/working, so as to form the conduit arrangement 120b-y. For some embodiments, the fin 106a-y may be formed from one or more layers made of a material, which comprises or consists of a metal or a metal alloy, by way of roll-bonding, so as to form the conduit arrangement 120b-y.

For some embodiments, it may be defined that the conduit arrangement 120b-y, and/or the one or more conduits 122a-c, forms/form a space sealed off from the ambient air surrounding the apparatus 100a-y. For some embodiments, it may be defined that the conduit arrangement 120b-y is configured such that a vapour of the fluid travels from the boiling region 124 to the condensation region 126. For some embodiments, it may be defined that the conduit arrangement 120b-y is configured such that heat is carried by the fluid from the boiling region 124 to the condensation region 126. For some embodiments, it may be defined that in the boiling region 124 the apparatus 100a-y is configured to turn a liquid of the fluid in conduit arrangement 120b-y into a vapour by allowing the liquid to absorb heat from the heat source 102 and undergo the phase change process, i.e. boiling. For some embodiments, it may be defined that the conduit arrangement 120b-y is configured such that a liquid of the fluid is returned back to the boiling region 124 by way of any one of gravity and a pressure difference, or by way of both gravity and pressure difference in combination.

With reference to FIG. 3B, for some embodiments, the fin 106b may include a first end portion 166 and a second end portion 168. The fin 106b may have a transverse extension 170 extending from the first end portion 166 to the second end portion 168. For some embodiments, it may be defined that the boiling region 124 is located in the first end portion 166 while the condensation region 126 is located in the second end portion 168. For some embodiments, it may be defined that the first end portion 166 includes the boiling region 124 while the second end portion 168 includes the condensation region 126.

With reference to FIGS. 15 and 16, for some embodiments, it may be defined that the heat sink base 114 has a transverse extension 172 configured to extend in a horizontal direction 174 when the apparatus 100a-y is installed. With reference to FIGS. 1 to 16, for some embodiments, the heat sink 112 may comprise the heat sink base 114, wherein the one or more fins 106a-y is/are connected, or connectable, to the heat sink base 114, for example by being welded or attached by any other mechanical means of attachment, such as by a friction attachment, a positive locking attachment, a snap-on attachment, or a snap-in attachment, or by being formed integrally with the heat sink base 114. Other ways of attachment are possible.

With reference to FIG. 16, for some embodiments, the multiple fins 106a-y may be connected or connectable to a heat sink front 176. For some embodiments, the heat sink 112 may comprise the heat sink front 176, wherein the one or more fins 106a-y is/are connected to the heat sink front 176, for example by being welded or attached by any other mechanical means of attachment, such as by a friction attachment, a positive locking attachment, a snap-on attachment, or a snap-in attachment, or by being formed integrally with the heat sink front 176. Other ways of attachment are possible.

With reference to FIGS. 1 to 16, for some embodiments, the position and configuration of the boiling chambers 104b-e and of the conduit arrangement 120b-y may be adapted to the heat load map of the one or more heat sources 102. The heat load map is a map of the locations of the heat sources 102, the sizes of the heat sources 102 and the power of the heat sources 102. For some embodiments, the apparatus 100a-y, the fin 106a-y, and/or the conduit arrangement 120b-y, may be described to apply flow boiling instead of pool boiling, which takes place in the boiling region 124.

When an item is disclosed to be connected to another item in this disclosure, it may imply that the two items are fluidly connected to one another. When an item is disclosed to be connected to another item in this disclosure, it may imply that the two items are mechanically connected to one another. When an item is disclosed to be connected to another item in this disclosure, it may imply that the two items are both fluidly and mechanically connected to one another.

The embodiments of the present application also comprise a network access node for a wireless communication system, wherein the network access node comprises an apparatus 100a-y according to any one of the embodiments disclosed above. The network access node herein may also be denoted as a radio network access node, an access network access node, an access point, or a base station, e.g. a Radio Base Station (RBS), which in some networks may be referred to as transmitter, "gNB", "gNodeB", "eNB", "eNodeB", "NodeB" or "B node", depending on the technology and terminology used. The radio network access nodes may be of different classes such as e.g. macro eNodeB, home eNodeB or pico base station, based on transmission power and thereby also cell size. The radio network access node can be a Station (STA), which is any device that contains an IEEE 802.11-conformant Media Access Control (MAC) and Physical Layer (PHY) interface to the Wireless Medium (WM). The radio network access node may also be a base station corresponding to the fifth generation (5G) wireless systems. The network access node may include an active antenna, a remote radio unit (RRU) or a base band processor. The network access node may include one or more antennas. The network access node may have a housing which houses the antenna. Alternatively, the antenna may be mounted outside the housing of the network access node, for example with a distance to the housing of the network access node.

Finally, it should be understood that the present application is not limited to the embodiments described above, but also relates to and incorporates all embodiments within the scope of the appended independent claim.

What is claimed is:

1. An apparatus for transferring heat from a heat source to air when the apparatus is connected to the heat source,
   a heat sink (112) comprising a plurality of fins connected or connectable to a heat sink base; and
   the heat sink base configured to be thermally coupled to the heat source, the heat sink base having a first longitudinal extension configured to extend in a vertical direction when the apparatus is installed,
   wherein a fin of the plurality of fins is configured as follows:
      the fin comprises a conduit arrangement comprising one or more conduits configured to enclose a heat-carrying fluid,
      the fin comprises a boiling region and a condensation region through which the heat-carrying fluid is conveyed,
      the boiling region of the fin is positioned between the heat sink base and the condensation region of the fin,
      the fin comprises a bottom portion and a top portion,
      the fin has a second longitudinal extension extending from the bottom portion to the top portion, the second longitudinal extension of the fin extends in the direction of the first longitudinal extension of the heat sink base, in the boiling region, the conduit arrangement comprises a vapour guiding path, the vapour guiding path has a third longitudinal extension extending in the direction of the second longitudinal extension of the fin, in the boiling region, the conduit arrangement comprises one or more boiling chambers in which at least a portion of the heat-carrying fluid evaporates, wherein each boiling chamber of the one or more boiling chambers has an outer boundary, wherein the respective boiling chamber is located within a corresponding chamber region defined by an imaginary quadrilateral having a first side, a second side, a third side, a fourth side, a first vertex, a second vertex, a third vertex, and a fourth vertex, wherein the first vertex and the second vertex are located on the vapour guiding path, wherein the third vertex and the fourth vertex are displaced from the vapour guiding path, wherein the first vertex is located between the top portion of the fin and each one of the second, third, and fourth vertices, wherein the third vertex is located between the top portion of the fin and the fourth vertex, wherein the second vertex is located between the top portion of the fin and the fourth vertex, wherein the first side of the imaginary quadrilateral extending from the first vertex to the third vertex has one or more first tangent points with the outer boundary of the respective boiling chamber, wherein the third side of the imaginary quadrilateral extending from the second vertex to the fourth vertex has one or more second tangent points with the outer boundary of the respective boiling chamber, and wherein the respective boiling chamber is connected to the vapour guiding path via one or more orifices.

2. The apparatus according to claim 1, wherein the respective boiling chamber of the one or more boiling chambers comprises a fifth vertex and a sixth vertex limiting the one or more orifices, wherein the fifth and sixth vertices are located on the vapour guiding path, wherein the fifth vertex is located between the first vertex and the second vertex or at the position of the first vertex, and wherein the sixth vertex is located between the first vertex and the second vertex or at the position of the second vertex.

3. The apparatus according to claim 2, wherein the respective boiling chamber of the one or more boiling chambers is connected to the vapour guiding path via two orifices of the one or more orifices, wherein the fifth and sixth vertices are located between the first vertex and the second vertex, and wherein the first and fifth vertices limit one of the two orifices while the second and sixth vertices-limit the other one of the two orifices.

4. The apparatus according to claim 2, wherein the respective boiling chamber of the one or more boiling chambers is connected to the vapour guiding path via one orifice of the one or more orifices, wherein the fifth vertex is located at the position of the first vertex, wherein the sixth vertex is located at the position of the second vertex, and wherein the fifth and sixth vertices limit the orifice of the one or more orifices.

5. The apparatus according to claim 1, wherein a first acute angle formed between the first side of the imaginary quadrilateral and a first axis intersecting the first vertex and being perpendicular to the direction of the second longitudinal extension of the fin is greater than zero degrees and less than or equal to 90 degrees.

6. The apparatus according to claim 5, wherein a second acute angle formed between the third side of the imaginary quadrilateral and a second axis intersecting the second vertex and being perpendicular to the direction of the second longitudinal extension of the fin is greater than zero degrees and less than or equal to 90 degrees.

7. The apparatus according to claim 6, wherein the first acute angle is equal to the second acute angle.

8. The apparatus according to claim 6, wherein the first acute angle is greater than the second acute angle.

9. The apparatus according to claim 1, wherein the second side of the imaginary quadrilateral extending from the third vertex to the fourth vertex has one or more third tangent points with the outer boundary of the respective boiling chamber.

10. The apparatus according to claim 1, wherein the respective boiling chamber of the one or more boiling chambers comprises a conduit loop having two orifices.

11. The apparatus according to claim 1, wherein the respective boiling chamber comprises a hexagonal conduit.

12. The apparatus according to claim 1, wherein the respective boiling chamber of the one or more boiling chambers is configured to trap fluid in liquid form transported by a stream of fluid in vapour form flowing in the vapour guiding path in the direction of the second longitudinal extension of the fin.

13. The apparatus according to claim 1, wherein the conduit arrangement in the fin comprises two or more interconnection conduits connecting the one or more conduits of the boiling region to the one or more conduits of the condensation region, wherein the two or more interconnection conduits have one or more longitudinal fourth extensions, and wherein a third acute angle is formed between the one or more fourth longitudinal extensions the of the two or more interconnection conduits and a third axis perpendicular to the direction of the second longitudinal extension of the fin.

14. The apparatus according to claim 1, wherein the fin comprises two or more conduit arrangements comprising the conduit arrangement.

15. A network access node for a wireless communication system, wherein the network access node comprises the apparatus according to claim 1.

16. The apparatus according to claim 1, wherein one or more other fins in the plurality of fins are configured the same as the fin in the plurality of fins.

* * * * *